United States Patent
Kruit et al.

(10) Patent No.: US 12,362,131 B2
(45) Date of Patent: Jul. 15, 2025

(54) METHOD FOR INSPECTING A SPECIMEN AND CHARGED PARTICLE BEAM DEVICE

(71) Applicants: APPLIED MATERIALS ISRAEL LTD., Rehovot (IL); TECH-NISCHE UNIVERSITEIT DELFT, Delft (NL)

(72) Inventors: Pieter Kruit, Delft (NL); Ron Naftali, Shoham (IL); Jürgen Frosien, Riemerling (DE); Ralf Schmid, Poing (DE); Benjamin John Cook, Munich (DE); Roman Barday, Poing (DE); Dieter Winkler, Poing (DE)

(73) Assignees: Applied Materials Israel Ltd, Rehovot (IL); TECHNISCHE UNIVERSITEIT DELFT, Delft (NL)

( * ) Notice: Subject to any disclaimer, the term of this patent is extended or adjusted under 35 U.S.C. 154(b) by 153 days.

(21) Appl. No.: 17/770,576

(22) PCT Filed: Oct. 21, 2019

(86) PCT No.: PCT/EP2019/078504
§ 371 (c)(1),
(2) Date: Apr. 20, 2022

(87) PCT Pub. No.: WO2021/078352
PCT Pub. Date: Apr. 29, 2021

(65) Prior Publication Data
US 2022/0392735 A1    Dec. 8, 2022

(51) Int. Cl.
*H01J 37/147* (2006.01)
*H01J 37/05* (2006.01)
(Continued)

(52) U.S. Cl.
CPC ......... *H01J 37/1477* (2013.01); *H01J 37/05* (2013.01); *H01J 37/12* (2013.01); *H01J 37/1475* (2013.01);
(Continued)

(58) Field of Classification Search
CPC ........ H01J 37/00; H01J 37/02; H01J 37/1477; H01J 37/05; H01J 37/12; H01J 37/1475;
(Continued)

(56) References Cited

U.S. PATENT DOCUMENTS

| 9,754,759 B2 | 9/2017 | Cook et al. |
| 9,922,796 B1 | 3/2018 | Frosien et al. |

(Continued)

FOREIGN PATENT DOCUMENTS

| CN | 105765691 A | 7/2016 |
| CN | 109216143 A | 1/2019 |

(Continued)

OTHER PUBLICATIONS

International Preliminary Report on Patentability for International Application No. PCT/EP2019/078504, mailed May 5, 2022, 16 Pages.

(Continued)

*Primary Examiner* — Jason L McCormack
(74) *Attorney, Agent, or Firm* — Lowenstein Sandler LLP

(57) ABSTRACT

A charged particle beam device for irradiating or inspecting a specimen is described. The charged particle beam device includes a charged particle beam source for generating a primary charged particle beam and a multi-aperture lens plate having a plurality of apertures for forming four or more primary. Two or more electrodes having one opening, e.g. having one opening each, for the primary charged particle beam or the four or more primary beamlets are provided. The charged particle beam device further includes a colli- (Continued)

mator for deflecting a first primary beamlet, a second primary beamlet, a third primary beamlet, and a fourth primary beamlet of the four or more primary beamlets with respect to each other. The charged particle beam device further includes an objective lens unit having three or more electrodes, each electrode having openings for the four or more primary beamlets.

26 Claims, 22 Drawing Sheets

(51) Int. Cl.
    *H01J 37/12*     (2006.01)
    *H01J 37/20*     (2006.01)
    *H01J 37/28*     (2006.01)

(52) U.S. Cl.
    CPC .............. *H01J 37/20* (2013.01); *H01J 37/28* (2013.01); *H01J 2237/0453* (2013.01); *H01J 2237/24592* (2013.01); *H01J 2237/2817* (2013.01)

(58) Field of Classification Search
    CPC .. H01J 37/20; H01J 37/26; H01J 37/28; H01J 37/3177; H01J 37/10; H01J 2237/0453; H01J 2237/24592; H01J 2237/2817
    USPC ................................ 250/306, 307, 310, 311
    See application file for complete search history.

(56) References Cited

U.S. PATENT DOCUMENTS

| | | | |
|---|---|---|---|
| 2003/0001095 A1 | 1/2003 | Lo et al. | |
| 2009/0140160 A1 | 6/2009 | Platzgummer et al. | |
| 2014/0117232 A1 | 5/2014 | Shachal et al. | |
| 2015/0243475 A1 | 8/2015 | Shachal et al. | |
| 2015/0378342 A1* | 12/2015 | Ito | G05B 13/0265 438/514 |
| 2018/0158642 A1* | 6/2018 | Frosien | H01J 37/28 |
| 2019/0013176 A1 | 1/2019 | Breuer | |
| 2019/0259570 A1* | 8/2019 | Kruit | H01J 37/147 |

FOREIGN PATENT DOCUMENTS

| | | |
|---|---|---|
| TW | 201833967 A | 9/2018 |
| TW | 201919087 A | 5/2019 |
| TW | 201937526 A | 9/2019 |
| TW | 201941244 A | 10/2019 |
| WO | 2014188882 A1 | 11/2014 |
| WO | 2017193061 A1 | 11/2017 |
| WO | 2018099854 A1 | 6/2018 |

OTHER PUBLICATIONS

Office Action for Taiwanese Application No. TW109136230, dated Mar. 9, 2022, 15 Pages.
Office Action for Taiwanese Application No. TW109136230, dated Oct. 20, 2020, 14 Pages.
Office Action for Taiwanese Application No. TW111149162, dated Sep. 7, 2023 , 15 Pages.
PCT Notification of Transmittal of the International Search Report and the Written Opinion of the International Searching Authority for PCT Application No. PCT/EP2019/078504, mailed Sep. 4, 2020, 24 pages.
Taiwanese Office Action for TW Application No. TW109136230 dated Oct. 20, 2020, 14 pages.

* cited by examiner

FIG. 7C
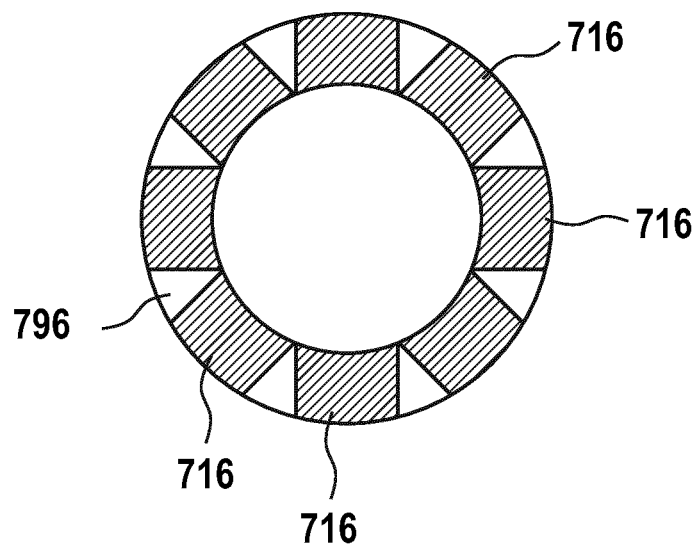
FIG. 8A
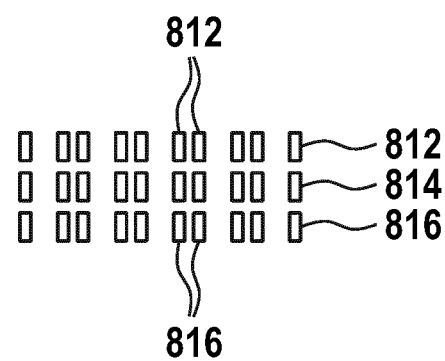
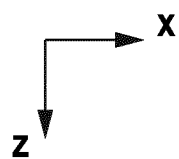

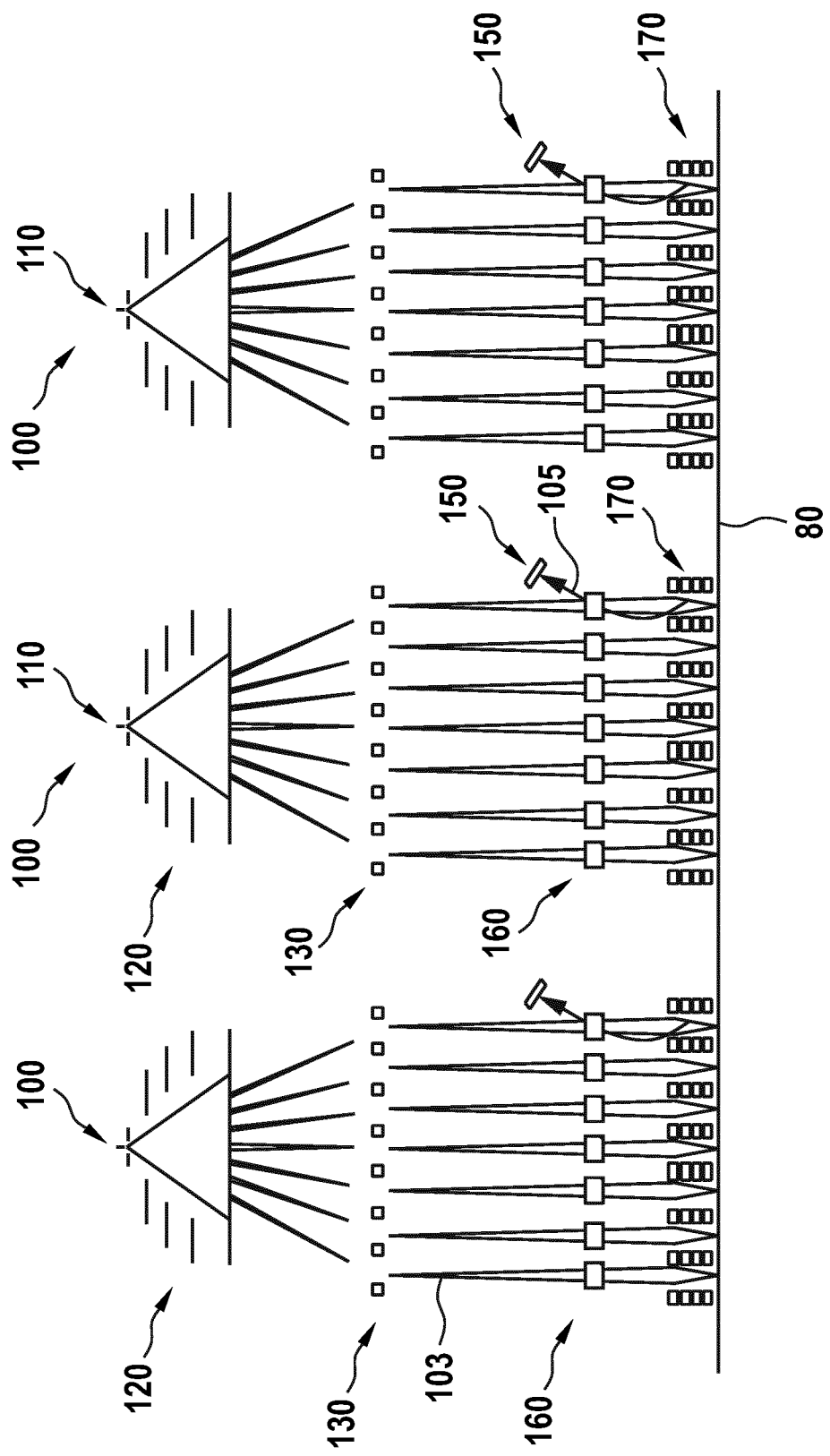

METHOD FOR INSPECTING A SPECIMEN AND CHARGED PARTICLE BEAM DEVICE

RELATED APPLICATION

This application is a National Stage entry under 35 U.S.C. § 371 of International Application No. PCT/EP2019/078504, filed Oct. 21, 2019, the disclosures of which are hereby incorporated by reference herein in their entireties.

FIELD

Embodiments relate to charged particle beam devices, for example, for inspection system applications, testing system applications, defect review or critical dimensioning applications or the like. Embodiments also relate to methods of operation of a charged particle beam device. More particularly, embodiments relate to charged particle beam devices being multi-beam systems for general purposes (such as imaging biological structures) and/or for high throughput EBI (electron beam inspection). Embodiments relate to an apparatus and method for inspecting a surface of a sample, using a multi-beam charged particle column.

BACKGROUND

Modern semiconductor technology is highly dependent on an accurate control of the various processes used during the production of integrated circuits. Accordingly, the wafers are inspected repeatedly in order to localize problems as early as possible. Furthermore, a mask or reticle is also inspected before the actual use during wafer processing in order to make sure that the mask accurately defines the respective pattern. The inspection of wafers or masks for defects includes the examination of the whole wafer or mask area, e.g. for 300 mm wafer production. Especially, the inspection of wafers during wafer fabrication includes the examination of the whole wafer area in such a short time that production throughput is not limited by the inspection process.

Scanning electron microscopes (SEM) have been used to inspect wafers. The surface of the wafer is scanned using e.g. a single finely focused electron beam. When the electron beam hits the wafer, secondary electrons and/or backscattered electrons, i.e. signal electrons, are generated and measured. A pattern defect at a location on the wafer is detected by comparing an intensity signal of the secondary electrons to, for example, a reference signal corresponding to the same location on the pattern. However, because of the increasing demands for higher resolutions, scanning the entire surface of the wafer takes a long time. Accordingly, using a conventional (single-beam) Scanning Electron Microscope (SEM) for wafer inspection is difficult, since the approach does not provide the respective throughput.

Wafer and mask defect inspection in semiconductor technology needs high resolution and fast inspection tools, which cover both full wafer or mask application or hot spot inspection. Electron beam inspection gains increasing importance because of the limited resolution of light optical tools, which are not able to handle the shrinking defect sizes. In particular, from the 20 nm node and beyond, the high-resolution potential of electron beam based imaging tools is in demand to detect all defects of interest.

In view of the above, a charged particle multi-beam device and a method for inspecting a specimen with an array of beamlets of charged particles is provided that overcome at least some of the problems in the art.

SUMMARY

In light of the above, a charged particle beam device, a charged particle beam device assembly, a method for inspecting a specimen with an array of beamlets of charged particles and a method of aligning an array of four or more primary beamlets are provided. Further aspects, advantages, and features are apparent from the dependent claims, the description, and the accompanying drawings.

According to one embodiment, a charged particle beam device for irradiating or inspecting a specimen with an array of primary beamlets is provided. The charged particle beam device includes a charged particle beam source for generating a primary charged particle beam; a multi-aperture lens plate having a plurality of apertures for forming four or more primary beamlets from the primary charged particle beam; two or more electrodes having one opening for the primary charged particle beam or the four or more primary beamlets, the two or more electrodes and the multi-aperture lens plate can be biased to provide a focusing effect; a collimator for deflecting a first primary beamlet, a second primary beamlet, a third primary beamlet, and a fourth primary beamlet of the four or more primary beamlets with respect to each other; a beam separation unit for separating the four or more primary beamlets from four or more signal beamlets; a detection unit having detection surfaces, one or more detection surfaces being arranged between beam paths of the four or more primary beamlets; a scanning deflector assembly for scanning the four or more primary beamlets over a surface of the specimen; an objective lens unit having three or more electrodes, each electrode having openings for the four or more primary beamlets, the openings spaced apart at an opening distance, the objective lens unit is configured to focus the four or more primary beamlets on the specimen and to focus the four or more signal beamlets on the detection surfaces; and a stage for supporting the specimen.

According to one embodiment, a charged particle beam device assembly is provided. The charged particle beam device assembly includes a first charged particle beam device according to any of the embodiments described herein; and a second charged particle beam device for irradiating or inspecting the specimen with an array of primary beamlets. The second charged particle beam device includes a charged particle beam source for generating a primary charged particle beam; a multi-aperture lens plate having a plurality of apertures for forming four or more primary beamlets from the primary charged particle beam; two or more electrodes having one opening, e.g. having one opening each, for the primary charged particle beam or the four or more primary beamlets, the two or more electrodes and the multi-aperture lens plate can be biased to provide a focusing effect; a collimator for deflecting a first primary beamlet, a second primary beamlet, a third primary beamlet, and a fourth primary beamlet of the four or more primary beamlets with respect to each other; a beam separation unit for separating the four or more primary beamlets from four or more signal beamlets; a detection unit having detection surfaces, one or more detection surfaces being arranged between beam paths of the four or more primary beamlets; a scanning deflector assembly for scanning the four or more primary beamlets over a surface of the specimen; and an objective lens unit having three or more electrodes, each electrode having openings for the four or more primary beamlets, the openings spaced apart at an opening distance, the objective lens unit is configured to focus the four or more primary beamlets on the specimen and to focus the four or more signal beamlets on the detection surfaces.

According to an embodiment, a method for inspecting a specimen with four or more primary beamlets is provided. The method includes generating a primary charged particle beam with a charged particle source; generating the four or more primary beamlets with a multi-aperture lens plate and two or more electrodes; deflecting a first primary beamlet, a second primary beamlet, a third primary beamlet, and a fourth primary beamlet of the four or more primary beamlets with respect to each other with a collimator; scanning the four or more primary beamlets over a surface of the specimen with a scanning deflector assembly; focusing the four or more primary beamlets on the specimen with an objective lens unit to generate four or more signal beamlets, each electrode of the objective lens unit having openings for the four or more primary beamlets, the openings spaced apart at an opening distance; focusing the four or more signal beamlets on detection surfaces, wherein one or more detection surfaces being arranged between respective primary beamlets of the four or more primary beamlets; separating the four or more signal beamlets from the four or more primary beamlets with a beam separation unit to guide the four or more signal beamlets to the detection surfaces.

According to an embodiment, a method of aligning an array of four or more primary beamlets is provided. The method includes generating a primary charged particle beam with a charged particle source; generating the four or more primary beamlets with a multi-aperture lens plate and two or more electrodes; deflecting a first primary beamlet, a second primary beamlet, a third primary beamlet, and a fourth primary beamlet of the four or more primary beamlets with respect to each other with a collimator; controlling an alignment system upstream of the collimator to scan the four or more primary beamlets over openings in an aperture array; and measuring a current at one or more conductive surfaces on the aperture array.

Embodiments are also directed at apparatuses for carrying out the disclosed methods and include apparatus parts for performing each described method features. The method features may be performed by way of hardware components, a computer programmed by appropriate software, by any combination of the two or in any other manner. Furthermore, embodiments are also directed at methods which the described apparatus operates with. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following:

FIGS. 7B and 7C show schematic views of an alignment system according to embodiments of the present disclosure;

FIGS. 8A and 8B show schematic side views of a deflector array of a collimator according to embodiments described herein;

FIG. 23 shows a schematic view of a charged particle beam device assembly combining two or more charged particle beam devices according to embodiments of the present disclosure;

DETAILED DESCRIPTION OF EMBODIMENTS

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following the charged particle beam device or components thereof will exemplarily be referred to as a charged particle beam device including a primary electron beam and the detection of secondary or backscattered particles, such as electrons. As described herein, discussions and descriptions relating to the detection are exemplarily described with respect to electrons in scanning electron microscopes. Other types of charged particles, e.g. positive ions, could be emitted and/or detected by the device in a variety of different instruments. Embodiments relate to a primary beam, primary beamlets, and one or more signal beams of e.g. electrons. The primary beam, the primary beamlets, and/or the one or more signal beams may be provided by other charged particles as electrons. Further, the one or more signal beams may include other signals, such as corpuscles as described above.

According to embodiments herein, which can be combined with other embodiments, a signal (charged particle) beam, or a signal (charged particle) beamlet is referred to as a beam of secondary particles, i.e. secondary and/or backscattered electrons. The signal beam or secondary beam is generated by the impingement of the primary beam or primary beamlets on a specimen or by backscattering of the primary beam or the primary beamlets from the specimen. A primary charged particle beam or a primary charged particle beamlet is generated by a particle beam source and is guided and deflected on a specimen to be inspected or imaged.

A "specimen" or "sample" as referred to herein, includes, but is not limited to, wafers, semiconductor wafers, semiconductor workpieces, photolithographic masks and other workpieces such as memory disks and the like. Embodiments may be applied to any workpiece on which material is deposited or which is structured. According to some embodiments, which can be combined with other embodiments described herein, the apparatus and methods are configured for or are applied for electron beam inspection, for critical dimensioning applications and defect review applications.

Figure 1:
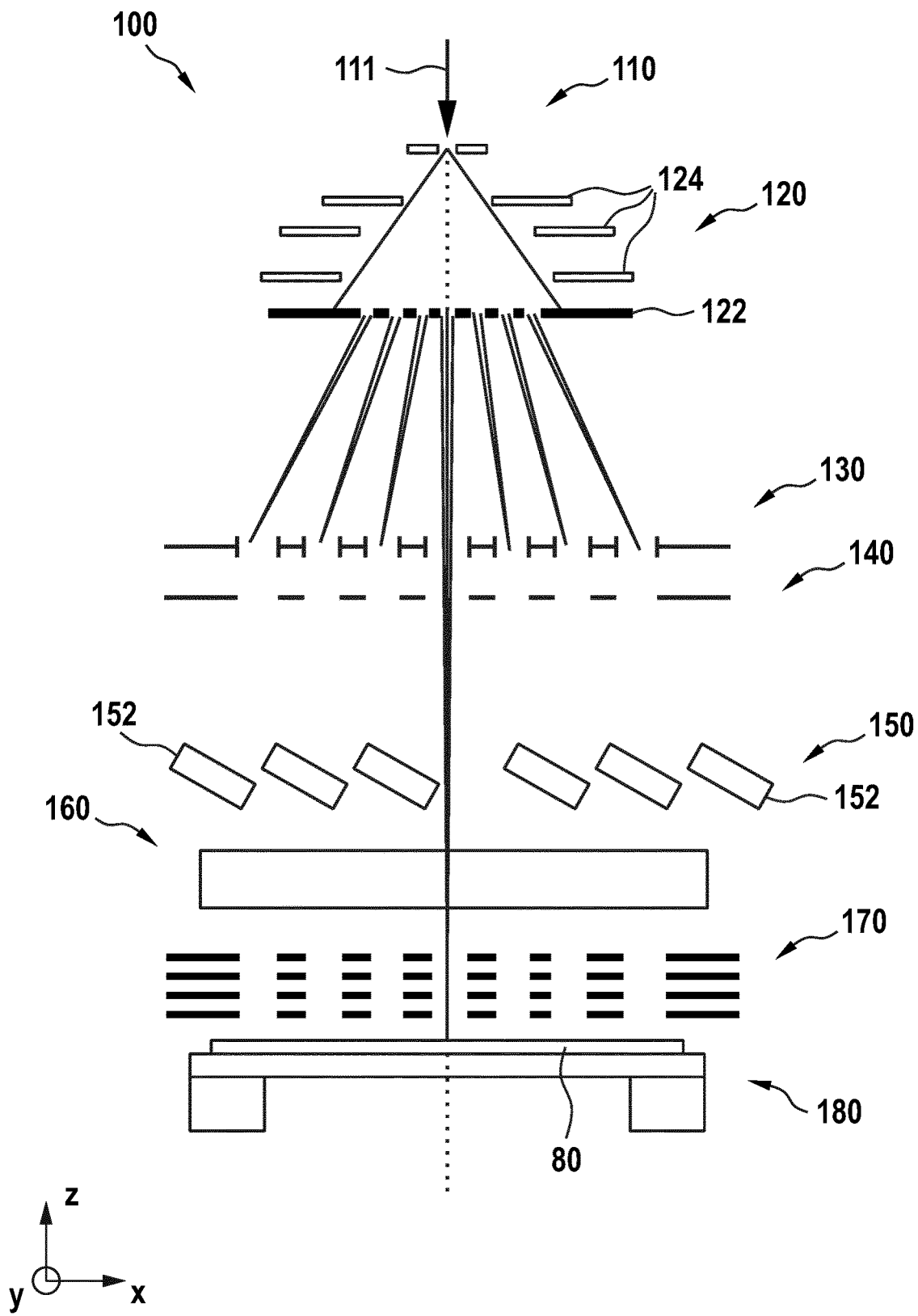
FIG. 1 shows a schematic view of a charged particle beam device for specimen inspection according to embodiments described herein.

Embodiments of the present disclosure provide a charged particle beam device 100, as exemplarily shown in FIG. 1. The charged particle beam device 100 includes a multibeam generator. The multibeam generator may include a charged particle beam source 110, two or more electrodes, and an aperture lens array. The charged particle beam source 110 includes a particle beam emitter 111, which emits a primary charged particle beam, for example an electron beam. According to embodiments described herein, the multibeam generator is configured to generate an array of primary charged particle beamlets. The charged particle beam source 110 emits a primary beam. The aperture lens array or multi-aperture lens plate 122 generates primary particle beamlets from the primary beam. The one or more electrodes and the multi-aperture lens plate may operate as electrodes of an electrostatic lens. Accordingly, the one or more electrodes can be lens electrodes. Particularly, the one or more electrodes can include an opening for the primary beam. The multi-aperture lens plate includes openings for generating the primary beamlets. The one or more electrodes, i.e. electrodes common to the beamlets and the multi-aperture lens plate act together, particularly as if the beamlets would be influenced by individual lenses corresponding to the openings or apertures in the multi-aperture lens plate.

The beamlets generated by the aperture lens array are collimated with a collimator 130. For example, the collimator can include one of a deflector array shown in FIG. 1 and a lens. The collimated beamlets may travel essentially parallel and/or along optical axes of an objective lens unit 170 onto a sample or a specimen 80. One or more further aperture arrays 140 can be provided. For example, an aperture array can be provided downstream of the collimator 130.

The beam separation unit 160 separates primary beamlets from the one or more signal beamlets, for example, signal beamlets corresponding to the primary beamlets. The signal beamlets can be detected with a detection unit 150. As an example, some detection surfaces 152 are shown in FIG. 1. According to embodiments described herein, one detection surface can be provided per signal beamlet or one detection surface can be provided per row of signal beamlets.

The objective lens unit 170 includes a plurality of electrodes having an array of holes or openings. The plurality of electrodes may act as an electrostatic lens on beamlets passing through corresponding holes and openings of the plurality of electrodes. The objective lens unit can be provided as a deceleration lens. The plurality of electrodes may be set to potentials decelerating the primary beamlets before impinging on the specimen.

The objective lens unit 170 focuses the beamlets, particularly individually, on the specimen 80. The specimen 80 can be provided on a stage 180, for example, a wafer holder with drives. For example, drives may move a specimen or sample in x, y, and z direction.

Figure 2:
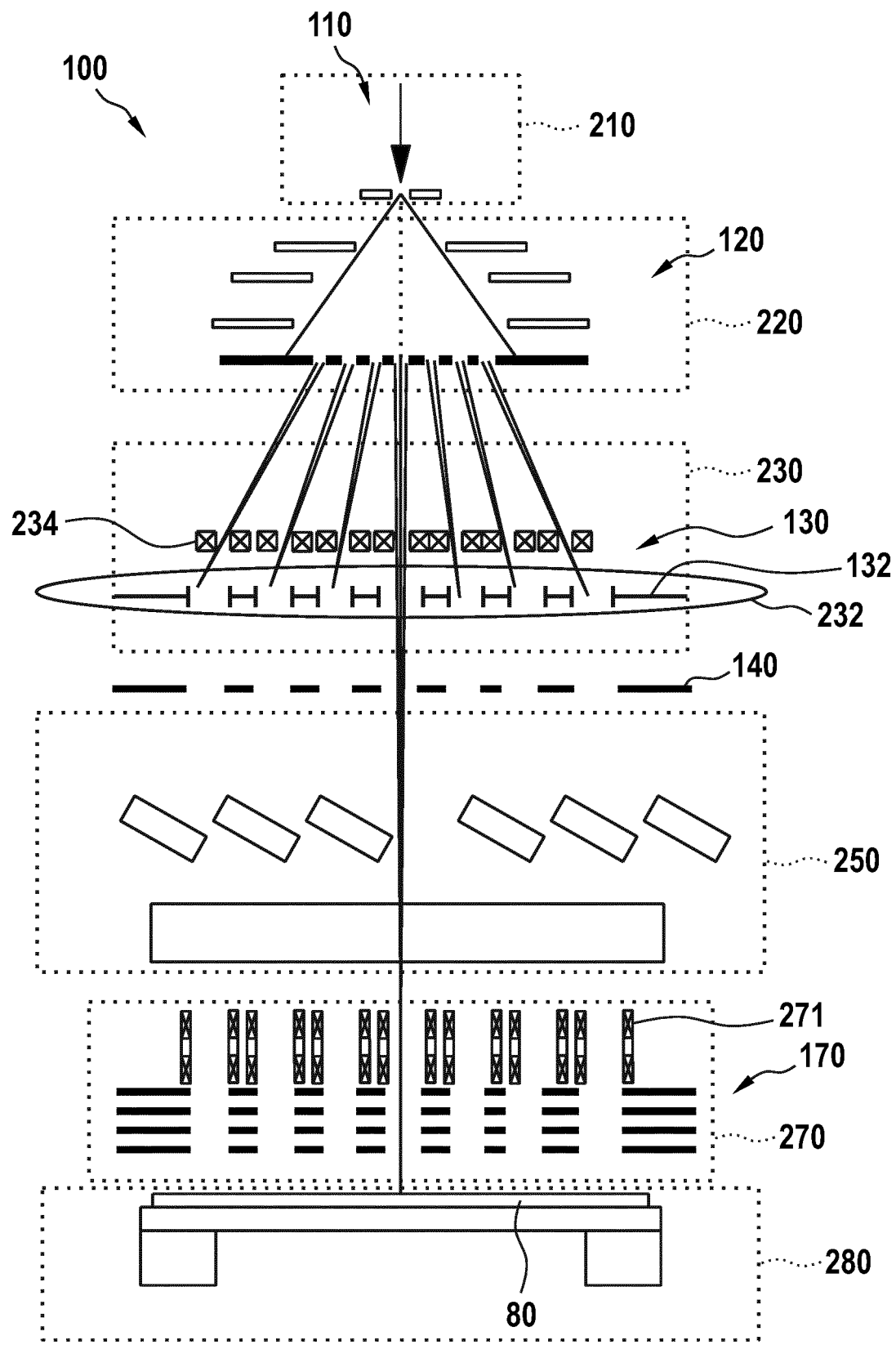
FIG. 2 shows a schematic view of another charged particle beam device for specimen inspection according to embodiments described herein.

FIG. 2 illustrates another exemplary embodiment of a charged particle beam device 100. The dotted boxes shown in FIG. 2 illustrate different portions of the charged particle beam device. For example, box 210 refers to the charged particle beam source 110. The box 220 refers to the combination of two or more electrodes and an aperture lens array. The box 230 refers to the collimator 130. Box 250 refers to the beam separation unit 160 and the detection unit 150. The box 270 refers to the objective lens unit 170. The box 280 refers to the stage 180. Aspects, features, details, and components will be described in more detail below while making reference to the respective boxes. According to embodiments of the present disclosure, features, aspects, details, components, modifications, and variations of the more detailed description can be combined with each other.

With respect to FIG. 2, it is further noted, that the collimator 130 may include a deflector array 132 as described herein as well as a lens 232 as described herein. Further, the collimator 130 or components associated with the box 230, i.e. components close to or adjacent to a collimator may include an alignment deflector system 234, which will be described in more detail below. Further, a charged particle beam device 100 may further include a scanning deflector assembly 271, which may be associated with box 270. For example, a scanning deflector assembly 271 scans the beamlets over the specimen 80 and can be within or close to the objective lens unit 170.

In the following, a multibeam generator is described with respect to FIGS. 3A to 6C. The multibeam generator includes a charged particle beam source 110, two or more electrodes and an aperture lens array.

Charged Particle Beam Source (Internal: Box 210)

According to some embodiments, which can be combined with other embodiments described herein, a charged particle beam source 110 (see also box 210) can include an emitter 111. Particularly, a single emitter can be provided, for example a high brightness emitter. The emitter can be of the Schottky type or of a field emitter type, such as a cold field emitter (CFE).

Schottky or TFE emitters are currently available with a measured reduced-brightness of up to $2\cdot10^8 Am^{-2}(SR)^{-1}V^{-1}$, CFE emitters have a measured reduced-brightness of up to $5\cdot10^9 Am^{-2}(SR)^{-1}V^{-1}$. For example, a charged particle beam, which has at least $5\cdot10^7 Am^{-2}(SR)^{-1}V^{-1}$ is beneficial. According to embodiments of the present disclosure, a high brightness emitter is provided. Accordingly, a beneficial current can be provided for each beamlet on the specimen such that a signal to noise ratio is provided for each beamlet that allows for high throughput. For example, according to some embodiments, which can be combined with other embodiments described herein, the emitter can have a brightness from $1\times10^8 Am^{-2}(SR)^{-1}V^{-1}$ to $5\times10^8$ $Am^{-2}(SR)^{-1}V^{-1}$, or even higher brightness as described above.

A charged particle beam emitter as described herein may be a cold field emitter (CFE), a Schottky emitter, a TFE or another high current high brightness charged particle beam source (such as an electron beam source). A high current is considered to be 5 µA in 100 mrad or above, for example up to 5 mA, e.g. 30 µA in 100 mrad to 1 mA in 100 mrad, such as about 300 µA in 100 mrad. According to some implementations, the current is distributed essentially uniformly, e.g. with a deviation of +−10%, particularly in the case of a linear or rectangular array. According to some embodiments, which can be combined with other embodiments described herein, the primary charged particle beam source or the source of the primary charged particle beamlets can have a diameter of 2 nm to 100 nm.

According to yet further embodiments, which can be combined with other embodiments described herein, a TFE or another high reduced-brightness source, e.g. an electron-beam source, capable of providing a large beam current is a source where the brightness does not fall by more than 20% of the maximum value when the emission angle is increased to provide a maximum of 10 µA-100 µA, for example 30 µA.

In some embodiments, the emitter 11 can be a single thermal field emission emitter, preferably of the Schottky type, for emitting a diverging electron beam. The primary beam, i.e. a single primary beam of the single emitter, can be emitted towards the multi-aperture lens plate 122. Multiple apertures are arranged for creating multiple primary beamlets, one primary beamlet per aperture.

According to yet further embodiments, which can be combined with other embodiments described herein, the charged particle beam source 110 may include at least one of a suppressor 312 and an extractor 314. Considering electrons as charged particles of the primary charged particle beam, the suppressor 312 may be at a negative potential as compared to the emitter 111. Considering electrons as charged particles of the primary charged particle beam, the extractor may be at a positive potential as compared to the emitter 111. According to embodiments described herein, the suppressor may inter alia control the current emitted from the emitter and the profile of the primary beam. The extractor may extract charged particles, such as electrons, from the tip of the emitter 111. Accordingly, e.g. an electrostatic field for field emission can be provided by the extractor.

Figure 3A:
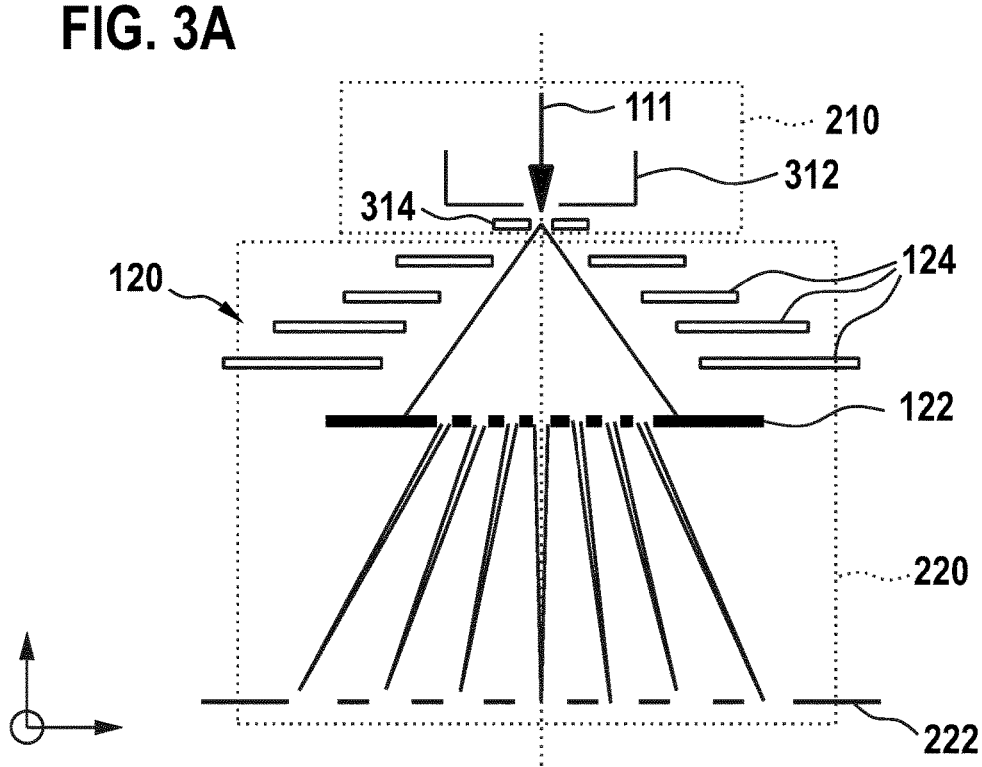
FIGS. 3A and 3B show schematic views of an aperture lens array of a multibeam generator according to embodiments of the present disclosure, wherein the aperture lens array is particularly provided in deceleration mode.

FIG. 3A shows a schematic view of a portion of a charged particle beam device having an emitter 111, a suppressor 312 and an extractor 314. Accordingly, a charged particle beam source 110 (see also box 210) is provided.

According to yet further embodiments, which can be combined with other embodiments described herein, a first electrode 324 can be provided to serve as an extractor. The first electrode 324 shown in FIG. 3B can be set to a potential, particularly relative to a potential of the tip of the emitter 111, at which electrons are emitted from the tip. Due to the small curvature of the sharply pointed tape and a potential difference of, for example, several kilovolts field emission may occur due to the high electric field. For Schottky type emitter, thermionic emission is enhanced by the high electric field.

Figure 3B:
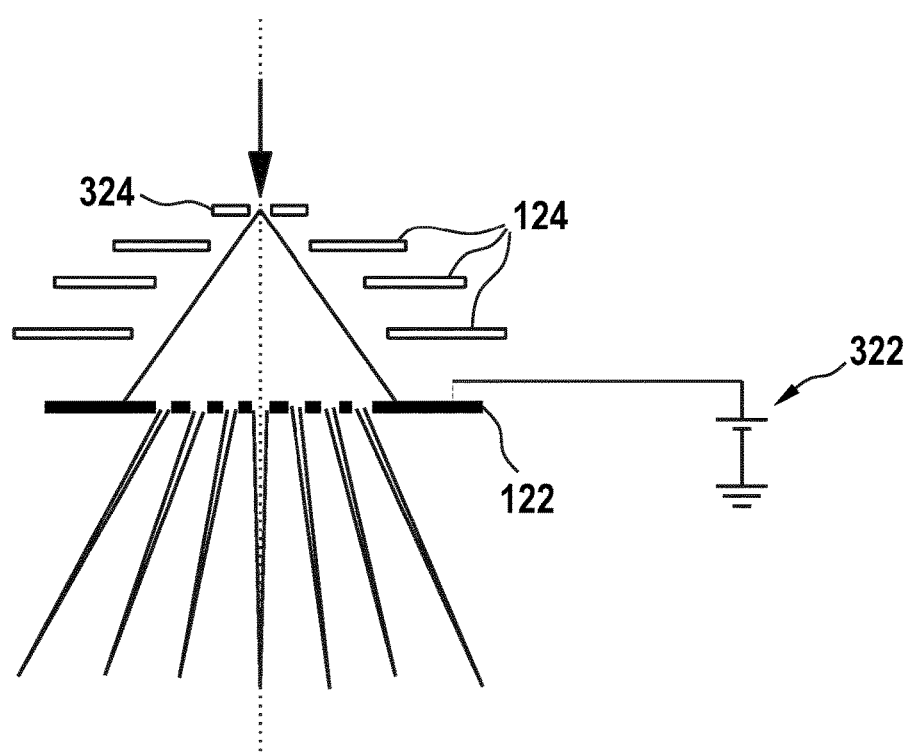
Figure 4A:
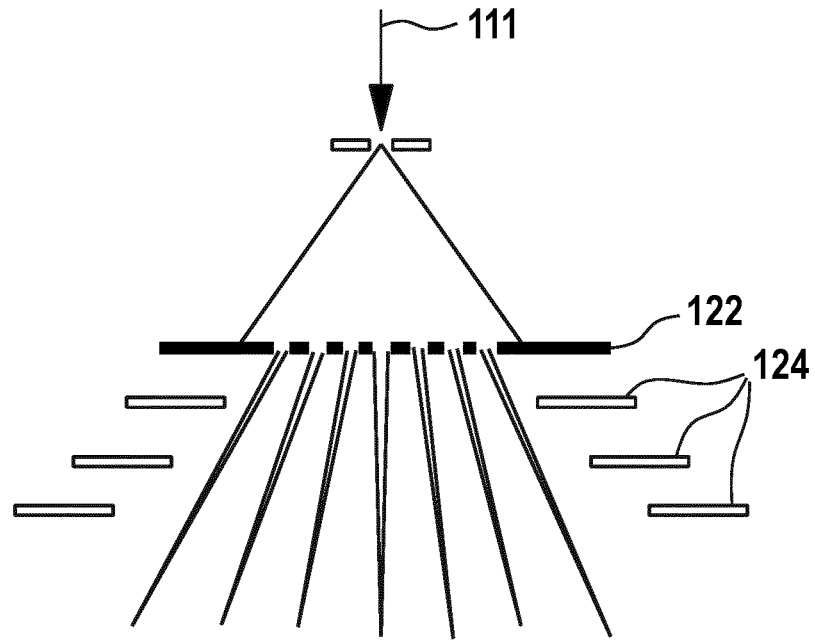
FIG. 4A shows a schematic view of an aperture lens array of a multibeam generator according to embodiments of the present disclosure, wherein the aperture lens array is particularly provided in acceleration mode.
Figure 4B:
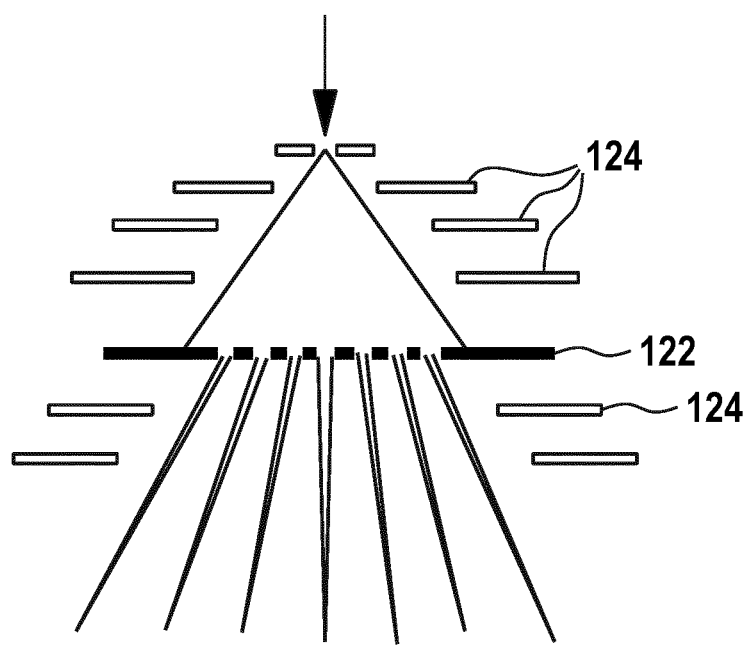
FIG. 4B shows a schematic view of an aperture lens array of a multibeam generator according to embodiments of the present disclosure.

According to some embodiments, which can be combined with other embodiments described herein, a potential difference between the tip of the emitter 111 and an extractor, for example extractor or 314 shown in FIG. 3A or electrode 324 shown in FIG. 3B can be 5 keV or above such as 10 keV or above. The extractor or a first electrode of the two or more electrodes extracts charged particles from the emitter. Further, the charged particles are accelerated to a high potential within the column. According to some embodiments, further electrodes may be provided to accelerate the charged particles, for example, the electron with the column. Charged particle energy in the column can be 8 keV or more, particularly at least 15 keV or more.

Common Electrodes And Aperture Lens Array (Internal: Box 220)

The multibeam generator includes two or more electrodes and an aperture lens array. FIG. 3A shows four electrodes 124 and the aperture lens array, i.e. a multi-aperture lens plate 122. According to some embodiments, which can be combined with other embodiments described herein, 2 to 6 electrodes, particularly electrostatic electrodes, and the multi-aperture lens plate can be provided. The multi-aperture lens plate includes a plurality of apertures. The aperture lens array (ALA) or multi-aperture plate generates one primary beamlet per aperture.

The aperture lens array is downstream of the charged particle beam source 110, the aperture array splits the diverging primary charged particle beam in multiple primary charged particle beamlets. In addition, the lenses generated for the beamlets by the electrodes and the multi-aperture lens plate focus each individual primary charged particle beamlet in a plane, which is indicated by plane 222 in FIG. 3A. The plane 222 is downstream of the multi-aperture lens plate, i.e. the multi-aperture lens plate 122 is between the plane 222 and the emitter 111.

Accordingly, the charged particle beam source and the ALA constitute a multibeam generator for creating multiple primary charged particle beamlets, which are directed towards a surface of a sample. The aperture lens array, i.e. the multi aperture lens plate, interacts with two or more electrodes 124. The two or more electrodes and the aperture lens plate are biased to form an electrostatic lens field for the primary beam or generate the primary beamlets, respectively. That is the two or more electrodes and the aperture plate generate a plurality of virtual beam sources corresponding to the beamlets.

According to some embodiments, the multi-aperture lens plate 122 can be provided downstream of the two or more electrodes 124, as for example shown in FIG. 3A. In other words, the two or more electrodes 124 are provided between the multi-aperture lens plate 122 and the charged particle beam source and/or the emitter 111, respectively. The two or more electrodes operate in the deceleration mode. According to yet further embodiments, which can be combined with other embodiments described herein, the two or more electrodes 124 can be downstream of the multi-aperture lens plate 122. In other words, the multi-aperture lens plate 122 can be between the two or more electrodes 124 and the charged particle beam source and/or the emitter, respectively. Accordingly, the two or more electrodes operate in an acceleration mode. This is, for example, shown in FIG. 4A. According to yet further embodiments, as exemplarily shown in FIG. 4B, two or more electrodes 124 can be provided. The multi-aperture lens plate can be provided between two electrodes of the two or more electrodes 124. According to embodiments of the present disclosure, the two or more electrodes 124 may have aperture openings through which the primary charged particle beam can pass. For example, each of the two or more electrodes may have one opening through which the primary charged particle beam can pass or, with respect to electrodes downstream of the multi-aperture lens plate, each of the two or more electrodes may have one opening through which the primary beamlets can pass.

FIG. 3B illustrates a yet further modification of the aperture array, which can be combined with other embodiments of the present disclosure. A heater for the multi-aperture lens plate 122 is provided. The heater may include a power source 322. For example, the power source can provide a current for a heater provided at the multi-aperture lens plate 122. For example, a heating element can be attached to or embedded in the multi-aperture lens plate. Heating of the multi-aperture lens plate allows for removing contamination. The multi-aperture lens plate blocks a portion of the charged particle beam, i.e. the primary beam. Further, the apertures of the multi-aperture lens plate can provide beam limiting apertures to form the beamlets. Accordingly, contamination at the apertures may deteriorate beamlet formation. Accordingly, removal of contamination, for example by heating, provides an improved charged particle beam device and/or may reduce the need for maintenance.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. Further, a heater for heating the multi-aperture lens plate is provided. Heating the multi-aperture lens plate allows to prevent and/or remove contamination, particularly for the beam limiting apertures of the multi-aperture lens plate and, thus, to reduce maintenance.

According to some embodiments, which can be combined with other embodiments described herein, at least two electrodes 124 interacting with the multi-aperture lens plate 122 and at least one extractor is provided. The respective openings in the electrodes 124 can be varied in size, i.e. diameter. Further, the potentials of the extractor, the two or more electrodes, and the multi-aperture lens plate can be controlled independently. Adapting the distances between the electrodes, the opening sizes and the potentials allow to control aberration of the primary beamlets and the pitch of the primary beamlets at the collimator. It has to be noted that the according to some embodiments, the distances and opening sizes are designed and are determined and set after manufacturing. Accordingly, for a specific design the potentials may be varied during operation and other parameters may, for example, not be varied during operation. According to yet further embodiments, which can be combined with other embodiments, described herein, the disadvantage of lack of control of pitch or field curvature with only two electrodes between the extractor and the aperture plate, may be overcome by providing more than two electrodes. Accordingly, having three or more electrodes allows to match the pitch of the beamlets to the pitch of the collimator, i.e. the opening in the collimator 130 shown in FIG. 1.

For example, field curvature correction can be provided such that the focus of the plurality of primary beamlets is in a plane perpendicular to the optical axis of the charged particle beam device or in a plane parallel to the collimator, for example plane 222 shown in FIG. 3A.

According to some embodiments of illuminating a specimen or inspecting a specimen, the following operations may be provided. The primary charged particle beam is extracted from the charged particle beam source with an extractor. The primary charged particle beam is accelerated after extractor. The primary charged particle beam is decelerated towards the multi-aperture lens plate with the two or more electrodes. For example, a first electrostatic field between a last electrode of the two or more electrodes upstream of the multi-aperture lens plate and the multi-aperture lens plate is smaller than a second electrostatic field between a one-to-the-last electrode, the two or more electrodes and the last electrode. In light of the above, and particularly by providing additionally appropriate diameters of the two or more electrodes 124, decelerating, and optionally the accelerating, can be provided such that Cs and Cc of a lens formed by the multi-aperture lens plate and the two or more electrodes are minimized, a pitch of the four or more primary beamlets at the collimator matches a collimator pitch of the collimator. Yet further, additionally the deceleration, and optionally the acceleration, can be provided such that field curvature at the collimator is zero. Cc is the coefficient of chromatic aberration of the lens and Cs is the coefficient of spherical aberration of the lens.

According to yet further embodiments, which can be combined with other embodiments described herein, an extractor 314, three or more electrodes 124, such as for example 5 electrodes, and a multi-aperture lens plate 122 can be provided. For example, four electrodes 124 can be provided upstream of the multi-aperture lens plate 122 and one electrode 124 can be provided downstream of the multi-aperture lens plate 122. Providing more than two electrodes 124 provides at least one additional degree of freedom in primary beamlet control. Accordingly, the plane 222 (see FIG. 3A) in which each individual primary charged particle beamlet is focused can be move along the length of the column. For example, the focus of the primary beamlets (see, e.g. plane 22 in FIG. 3A) can be adapted to be downstream of the collimator.

According to yet further embodiments, which can be combined with other embodiments described herein, moving the focus of the primary beamlets allows for control of the magnification of the source on the specimen.

The aperture lens array includes at least one aperture opening per beamlet. The aperture openings can be situated in any array configuration on the multi-aperture lens plate 122 such as a line, rectangle, a square, a ring, or any suitable one-dimensional or two-dimensional array. For example, the beamlet array may be arranged in a line, a rectangle or a square.

By illuminating the multi-aperture lens plate 122 with the primary charged particle beam, several focused primary charged particle beamlets are created by using e.g. the deceleration field in front of the multi-aperture lens plate. In the focus plane of the primary charged particle beamlets, a lens or a deflector array may be arranged. In the figures, some of the primary charged particle beamlets of the array of primary charged particle beamlets are shown after the lens, while other primary charged particle beamlets are omitted in the drawings for the sake of a better overview.

In some embodiments, the multi-aperture lens plate 122 may be directly illuminated by the charged particle beam emitter 111. According to some embodiments, "directly" may mean that—apart from the two or more electrodes in embodiments having the field curvature correction electrodes in front of the multi-aperture lens plate (when seen in a direction of the propagating primary charged particle beam)—no additional optical elements are provided between the charged particle beam emitter 111 and the multi-aperture lens plate. The multi-aperture lens plate splits the primary charged particle beam emitted from the charged particle beam emitter into an array of primary charged particle beamlets. For instance, the multi-aperture lens plate has at least three aperture openings for splitting the primary charged particle beam into at least three primary charged particle beamlets. In the example shown in FIG. 1, seven primary charged particle beamlets are shown in the schematic view. In some embodiments, the primary charged particle beamlets may be arranged in a one-dimensional (line) array or a 2-dimensional array (e.g. 4×4, 3×3, 5×5) or a rectangular array e.g. 2×5. Embodiments described herein are not limited to the examples of arrays and may include any suitable array configuration of primary charged particle beamlets.

The described multi-aperture lens plate can be beneficially used in other embodiments relating to charged particle beam devices, systems including arrays of charged particle beam devices and methods of operating charged particle beam devices. The design of the multi-aperture lens plate beneficially follows different criteria and has to be considered in the context of the overall charged particle optical ray path design. In some embodiments, which may be combined with other embodiments described herein, a multi-aperture lens plate may be provided with one or more of the following features. The number of aperture openings is a compromise between largest possible total current and optical performance, in particular achievable spot size in the largest possible beamlet field. Another boundary condition is the beamlet separation on the specimen, which assures a signal beamlet separation on the detectors, wherein crosstalk is reduced or avoided. According to yet further embodiments, which can be combined with other embodiments described herein, the grid configuration (i.e. the positions of the primary beamlets on the specimen and/or the positions of the aperture openings in the aperture plate) is provided to allow for a complete coverage of an area of a substrate surface during a scan. The coverage is not limited to a pure charged particle beamlet scan, e.g. in the x-y-direction, but also includes a mixed scan operation like charged particle beamlet scan, e.g. in a first direction, such as the x-direction, and a stage movement, e.g. in another direction different from the first direction, such as the y-direction.

Figure 5A:
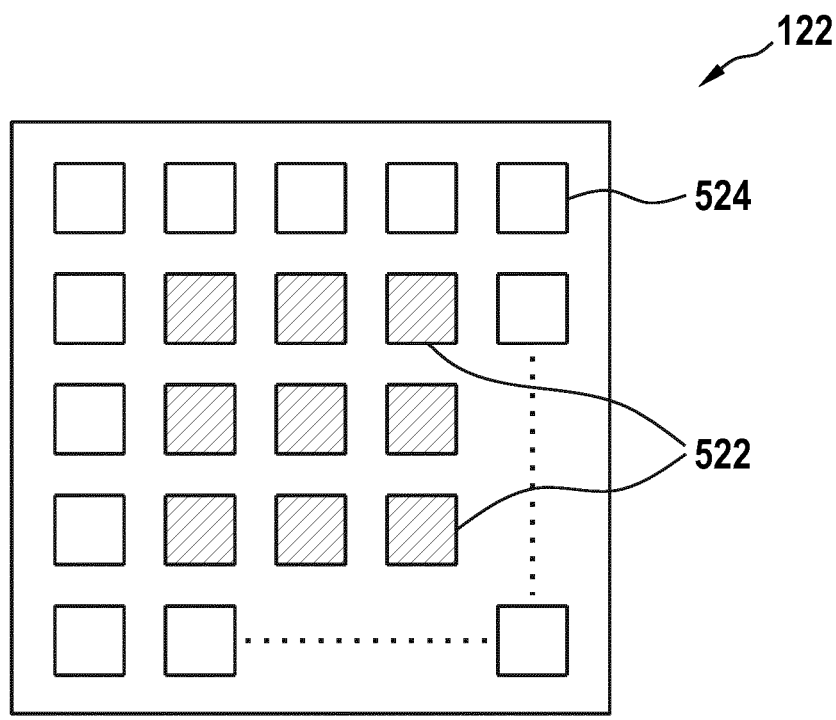
FIGS. 5A and 5B show schematic views of multi-aperture lens plates (an aperture lens array) according to embodiments of the present disclosure.
Figure 5B:
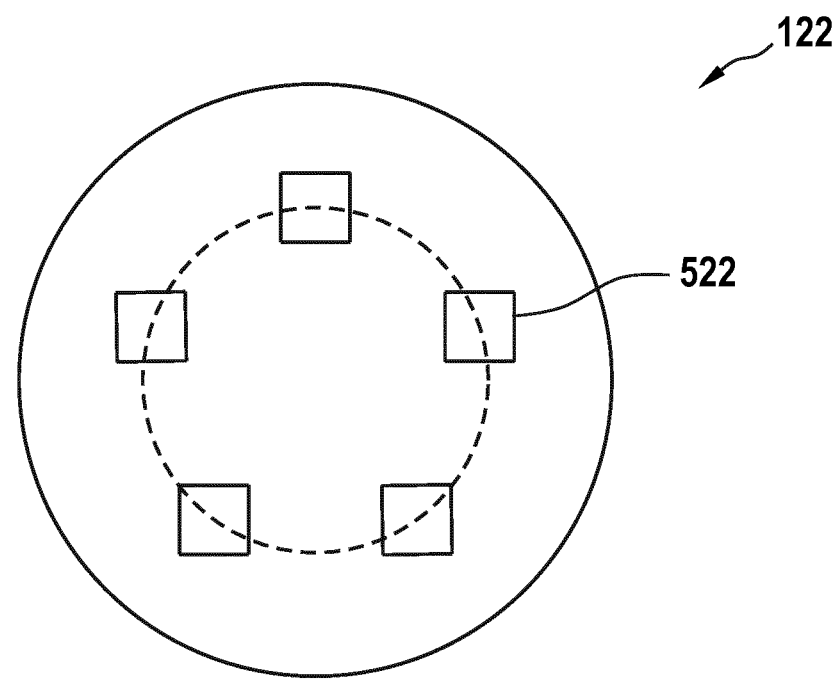
Figure 6A:
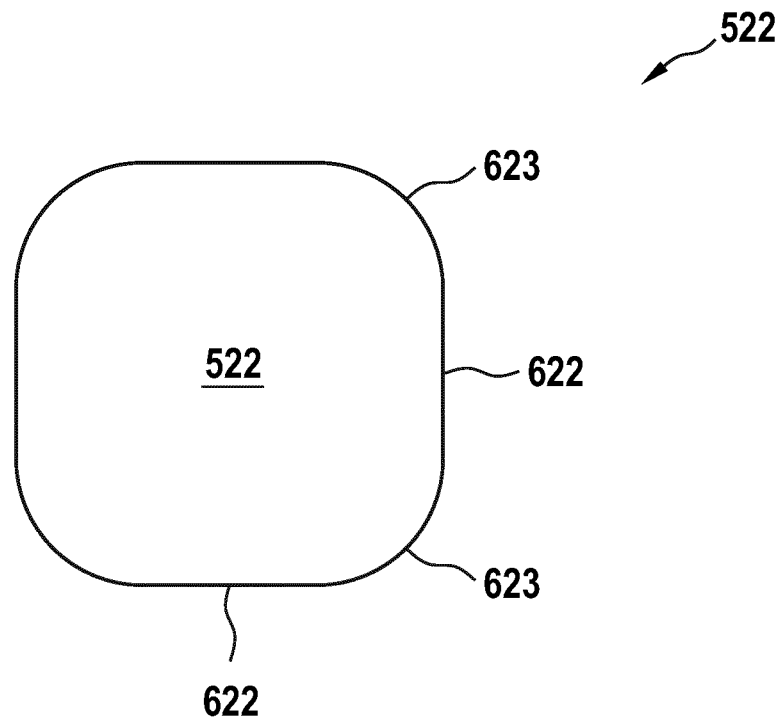
FIGS. 6A and 6B show schematic views of apertures of multi-aperture lens plates according to embodiments of the present disclosure.
Figure 6B:
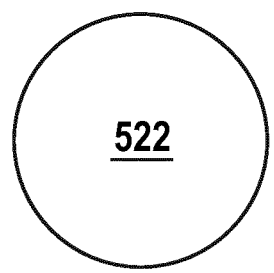

FIGS. 5A and 5B show examples of multi-aperture lens plates 122 according to embodiments of the present disclosure. Further, modifications of aperture openings of multi-aperture lens plates are shown in FIGS. 6A to 6C. Modifications to the multi-aperture lens plate and/or the aperture openings can be combined with other embodiments described herein. FIG. 5A shows a multi-aperture lens plate 122 having aperture openings 522. The aperture openings are arranged in an array. According to some embodiments, a square array or square pattern of aperture openings can be provided. Other arrays or patterns can be provided as described above. For example, FIG. 5A shows a 3×3 array of aperture openings 522. Further openings 524 are provided for the multi-aperture lens plate. The further openings 524 can be considered dummy openings. Even though, further beamlets may be generated from the further openings 524, the further beamlets are not utilized for image generation. The further openings provide neighboring openings for the aperture openings 522. Accordingly, an aperture opening 522 which would have no neighboring aperture openings at each side for a minimum number of openings is provided with neighboring further openings to have a symmetric characteristic, particularly for the aperture openings generating primary beamlets for image generation. In light of the above, a hexapole effect or hexapole aberration that may occur for aperture openings having without the neighbor can be reduced.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. According to some embodiments, the plurality of apertures of the multi-aperture lens plate form an aperture array, wherein the number of apertures in the aperture array is larger than the number of primary beamlets impinging on the specimen. Providing more aperture openings than primary beamlets impinging on a specimen allows for reduced aberrations, particularly reduced octupole aberration, for primary beamlets at the perimeter of the array of primary beamlets.

According to some embodiments, which can be combined with other embodiments described herein, an array or pattern of aperture openings can be provided in a square or rectangular pattern. Yet further, a hexagonal pattern of aperture openings can be provided. The hexagonal pattern can be considered a honeycomb pattern.

As described above, the throughput is beneficially increased for inspection of semiconductor wafers and other applications. Accordingly, a multi-beam column is proposed according to embodiments of the present disclosure. To further increase the throughput, the overall current of the plurality of beamlets on the specimen is beneficially increased. Accordingly, the sum of the area of the aperture openings 522 is large as compared to the area of the multi-aperture lens plate or the area illuminated by the primary charged particle beam, respectively. Accordingly, the size of the openings is beneficially large. According to some embodiments, which can be combined with other embodiments described herein, the diameter of the aperture openings can be 60% or more as compared to the pitch of the aperture openings, for example, the distance center to center. For example, the diameter of the aperture openings can be 70% or more as compared to the pitch of the aperture openings.

As shown with respect to FIG. 6B, an aperture opening can have a round shape and, thus, a defined diameter. According to yet further embodiments, the aperture openings can have a different shape. Correspondingly, a size of the aperture opening can be 60% or more, particularly 70% or more of the pitch of the aperture openings. For example, the size of an aperture opening can be the smallest size of the aperture opening in an arbitrary direction. For example, a square aperture opening has a size of one side of the square and a rectangular aperture opening has size of the smaller side of the rectangle.

According to yet further embodiments, which can be combined with other embodiments described herein, the size and shape of the aperture opening may be provided to have an open area in the multi-aperture plate (i.e. the sum of the area of openings) of 50% or more, particularly of 70% or more, of the area of the multi-aperture lens within the array of openings.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam, wherein a size of the aperture in a first direction is at least 70% of a pitch of apertures in the first direction. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. Providing apertures with a comparably large size increases the sum of the areas of aperture openings, which increases the overall beam current of the primary beamlets on the specimen. Accordingly, the signal to noise ratio for imaging can be increased.

FIG. 5B shows an alternative arrangement of aperture openings 522 on a multi-aperture lens plate 122. The aperture openings can be arranged in a circle. This may reduce off-axis operations of optical elements common to the primary charged particle beam or the primary charged particle beamlets.

FIG. 6A shows an embodiment of an aperture opening 522. According to some embodiments, which can be combined with other embodiments described herein, an aperture opening can have a square shape or a substantially square shape. An octupole effect or octupole aberrations that may occur for round aperture openings can be reduced by a square shape or a substantially square shape. Further, the shape of the aperture opening can be substantially square and may include side edges 622 of the aperture opening. The side edges, particularly the four side edges, may have the same length. A corner 623 can be rounded. Accordingly, the average openings can be square with rounded edges at the corners. The rounded corners may further reduce in octupole effect or octupole aberrations.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam, wherein a shape of the plurality of apertures is square with rounded corners. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. Providing openings with a square shape with rounded corners reduced aberrations, particularly octupole aberration, for primary beamlets.

Collimator & Multi Apertures (Internal: Box 230)

According to embodiments of the present disclosure, which can be combined with other embodiments described herein, a collimator 130 and associated components can be provided downstream of the ALA. The collimator 130 collimates the beamlets. Accordingly, the diverging pattern or array of primary beamlets is redirected by the collimator 130. For example, the primary beamlets can be parallel or essentially parallel after the collimator. According to some embodiments, which can be combined with other embodiments described herein, the collimator 130 can be provided in or near the plane 222 shown in FIG. 3A. Near the plane is to be understood to have the collimator 130 within 20% of the focal length of the ALA. By arranging the plane 222, i.e. the focus plane of the ALA, in or near the collimator, distortions of the individual electron beams due to aberrations of the deflection, can be reduced.

According to yet further embodiments, as described above, magnification control may be provided by moving the plane 22 downstream of the ALA.

Figure 7A:
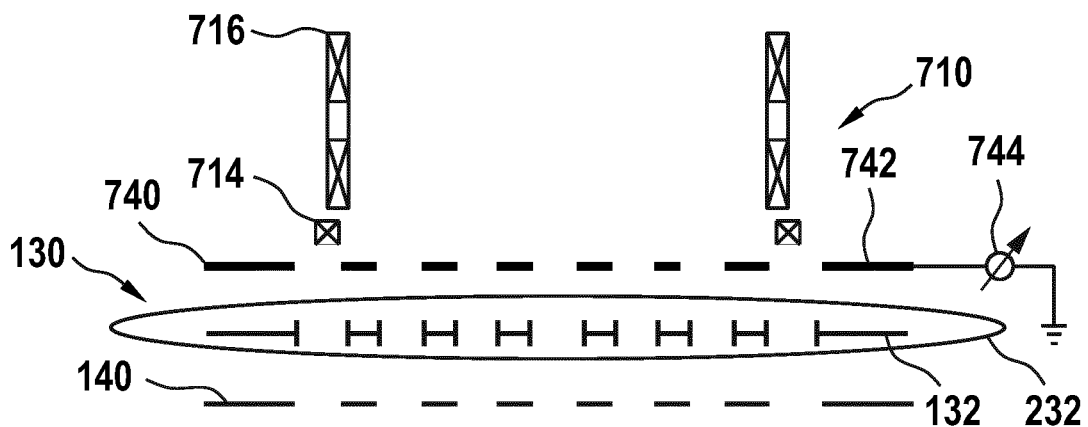
FIG. 7A show schematic views of a collimator and associated components such as aperture arrays and/or an alignment system according to embodiments of the present disclosure.

As shown in FIG. 7A, the collimator may include a deflector array 132 and a lens 232. According to yet further modifications, the collimator may include a deflector array or may alternatively include the lens 232. As described herein, the collimator, which may also be denoted the collimator deflection structure is configured for the primary beamlets from the aperture lens array to emerge parallel with respect to each other from the collimator.

Figure 8B:
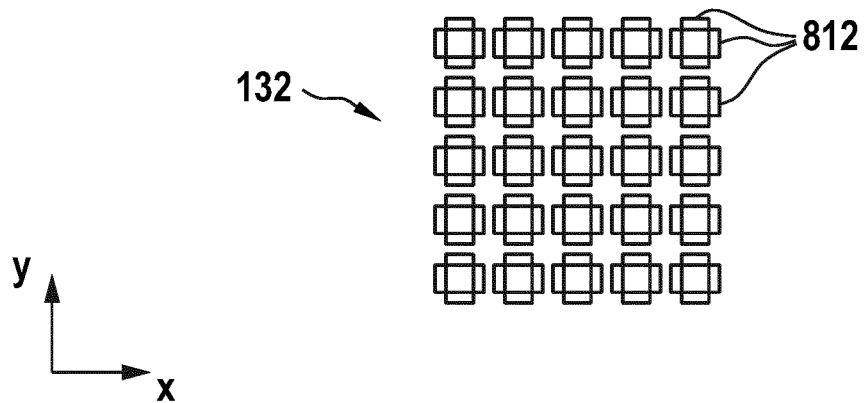

According to some embodiments, which can be combined with other embodiments described herein, each beamlet can be deflected by individual deflection electrodes. Deflection electrodes are exemplarily shown in FIGS. 8A and 8B. FIG. 8A shows deflector array 132 and an array of deflection electrodes 812. A pair of deflection electrodes is provided for x direction and y direction. Accordingly, collimation can be provided for each beam individually. For example, the deflection electrodes can be provided as a micro-electromechanical system (MEMS) and can be provided on a wafer.

According to implementations of the present disclosure, which can be combined with embodiments described herein, a plurality, for example, 4 or 8 deflection electrodes can be provided per primary beamlet. Each primary beamlet can be deflected individually. The collimator deflection structure may include a segmented collimator. The collimator deflection structure may include segmented deflectors for each of the primary beamlets.

According to yet further embodiments, as exemplarily shown in FIG. 8A, one or more deflector arrays can be provided along the axis of the charged particle beam column. A stack of deflectors or deflector arrays can, for example be provided on one or more wafers, such that alignment of the individual deflection electrodes per beamlet can be simplified. For example, first deflection electrodes 812 may deflect the beamlets in the x-direction, second deflection electrodes 814 may deflect the beamlets in the y-direction, a third deflection electrodes 816 can provide aberration correction, for example correction astigmatism.

Figure 9:
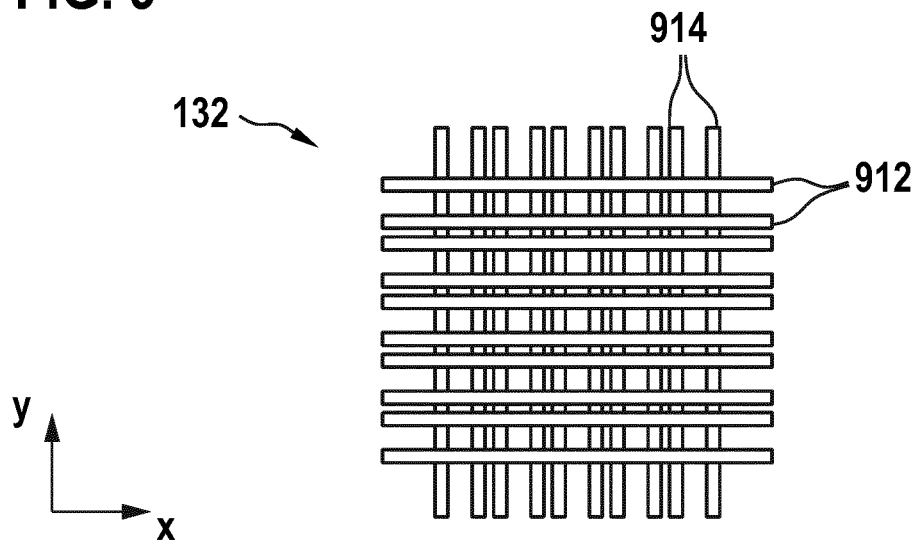
FIG. 9 shows a schematic top view of a deflector array of a collimator according to embodiments described herein.
Figure 10:
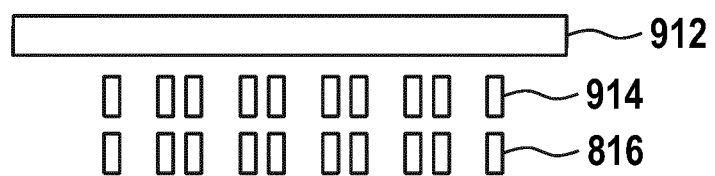
FIG. 10 shows a schematic side view of a deflector array of a collimator according to embodiments described herein, for example, the deflector array shown in FIG. 9.

According to yet further modifications, which can be combined with other embodiments described herein, a deflector array for collimating the primary beamlets may be provided by pairs of electrodes deflecting two or more primary beamlets. For example, FIG. 9 shows elongated electrodes 912 for deflecting a row of primary beamlets along the Y direction and elongated electrodes 914 for deflecting a row of primary beamlets along the x-direction. FIG. 9 shows a top view of deflector array 132 of collimator 130. FIG. 10 shows a side view of a deflector array. For example, the elongated electrodes 912 and the allocated electrodes 914 are shown. Further, individual deflectors similar to FIGS. 8A and 8B can be provided. The individual electrodes may be provided for fine adjustment of collimation or aberration correction.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. According to some embodiments, the collimator includes two or more first elongated electrodes for deflecting a row of the four or more primary beamlets along a first direction and two or more second elongated electrodes for deflecting a row of the four or more primary beamlets along a second direction different from the first direction. Accordingly, the array of primary charged particle beamlets can be guided with a reduced number of electrodes, which in turn results in a reduced number of power supplies and power supply connections.

The individual deflectors of a deflector array may be realized by multi-pole elements, which are at least 4th order (quadrupole). According to some embodiments, the multi-pole elements can be manufactured by conventional mechanical machining. According to particular embodiments, which can be combined with other embodiments described herein, microelectromechanical systems (MEMS) technology deflector elements can be beneficial, because MEMS technology deflector elements allow a higher multi-pole density and eases the wiring of the electrodes.

As described above and as shown in FIG. 7A, additionally to deflector array 132, a lens 232 can be provided. According to some embodiments, which are described in detail below, a deflector array 132 is arranged within or near the lens. According to some embodiments, the deflector array being arranged "in or near" or "within" the lens may be understood in that the deflector array is placed within the focal length of the lens. In particular, the deflector array may be placed within the lens. For instance, the lens may include three electrodes and the deflector array may be placed between two electrodes of the three electrodes. According to some embodiments, the deflector array may approximately be placed at the height of the middle electrode of the three electrodes of the lens.

According to some embodiments, the lens may be used for achieving the main effect of deflecting of the primary charged particle beamlets, especially for collimating the primary beamlets to emerge the collimator essentially parallel. The deflector array 132 may be used for fine adjustment of the individual primary charged particle beamlets, especially the fine adjustment of the primary charged particle beamlets to be guided into or through the coma free point of the objective lens. The charged particle beam device may include a controller for controlling the operational parameters of the lens and the deflector array (e.g. a controller being connected or integrated in a feedback loop or a monitoring device for monitoring the operation of the charged particle beam device).

According to some embodiments, which can be combined with other embodiments described herein, a lens 232 can be provided alternatively to the deflector array 132. For instance, the lens may include three electrodes.

According to some embodiments, the lens 232 may be an acceleration lens, in particular in the case, where the two or more electrodes are driven in a decelerating mode and/or are arranged in front of the multi-aperture lens plate (when seen in a direction of the propagating primary charged particle beam). In some embodiments, the lens 232 being provided as an acceleration lens (or in other embodiments as a deceleration lens) may be an electrostatic or a combined magnetic-electrostatic lens.

According to embodiments described herein, the primary charged particle beamlets are directed towards the lens 232. For instance, the lens 232 may be an acceleration lens for accelerating the primary charged particle beamlets propagating from the multi-aperture lens plate. The lens 232 may be used for accelerating the primary charged particle beamlets to a high column voltage in an embodiment, where the two or more electrodes are placed before the multi-aperture lens plate in a direction of the propagating primary charged particle beam. For instance, the acceleration lens may accelerate the primary charged particle beamlets to a column voltage of typically 10 kV or above, and more typically 20 kV or above. The accelerating voltage may determine the velocity at which the charged particles of the charged particle beamlets travel down the column. In one example, the acceleration lens may be an electrostatic lens.

According to yet further modifications of the components in box 230, which can be combined with other embodiments described herein, an alignment deflector system 234 can be provided. For example, coils can be provided between the aperture lens array and the collimator 130. The coils may generate positioning of the primary beamlets on the collimator apertures and/or may rotate the array of primary beamlets. Yet further, additionally or alternatively a quadrupole field may be provided for correcting the pitch of the array of primary beamlets in x-direction and/or y-direction.

FIG. 7A shows alignment deflectors 716 acting commonly on the plurality of primary beamlets. FIG. 7A shows alignment deflectors for a first direction. Further alignment deflectors may be provided for a second, different direction, e.g. orthogonal to the first direction. Further, an alignment coil rotating the array of primary beamlets is provided. The alignment deflectors 716 may provide deflection fields (dipole fields) in x-direction, y-direction, or a combination thereof. Further, the alignment deflectors 716 may provide quadrupole fields acting on the array of primary beamlets. Accordingly, the pitch of the array of primary beamlets in x-direction and/or y-direction can be adjusted or aligned.

Even though FIG. 7A shows an alignment deflector 716 having magnetic deflectors, an alignment deflector system may also be provided with electrostatic deflectors or a combination of magnetic deflectors and electrostatic deflectors.

Figure 7B:
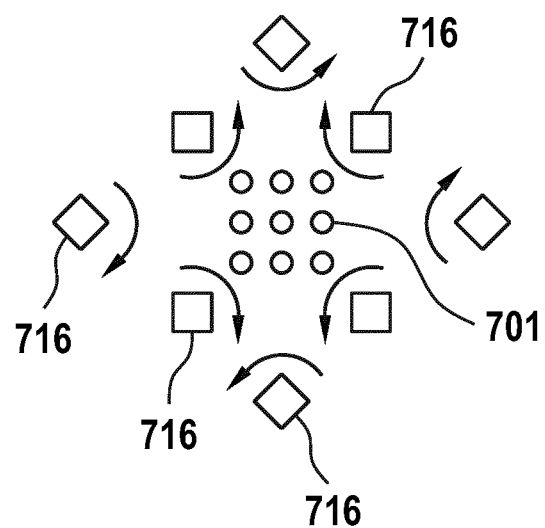

FIG. 7B shows an array of primary beamlets 701 at an alignment system 710. The alignment system may include two alignment coils for generating a first quadrupole field in a first direction (see arrows in FIG. 7B). The alignment system may include a further two alignment coils 716 for generating a second quadrupole field in a second direction. The first direction and the second direction may be rotated by about 45°. Accordingly, the shape of the array of primary beamlets 701 can be adapted. That is the pitch of the primary beamlets can be adapted in two directions, e.g. direction rotated by 45° to adjust for distortions on the array of primary beamlets. The quadrupole fields may be provided for correcting the pitch of the array of primary beamlets in x-direction and/or y-direction. A quadrupole field may squeeze the array in one direction and pull out the array in an orthogonal direction to adapt the pitch of the primary beamlets. Accordingly, a deflection and/or a squeezing of the array of beamlets can be provided.

FIG. 7A shows an implementation of the alignment system according to some embodiments. For example, a core 796 can be provided. The core having an opening for passing of the array of primary beamlets through the opening of the core. A plurality of alignment coils 716, such as all deflecting alignment coils and alignment coils providing the quadrupole field(s) can be provided at the core 796. Accordingly, a field having dipole portions and quadrupole portions for a combined deflection of the array and pitch adjustment of the array can be provided.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. The charged particle beam device further includes an alignment system provided between the multi-aperture lens plate and a collimator, wherein the alignment system includes at least one quadrupole to adapt the pitch between the four or more primary beamlets. Accordingly, the pitch of the primary beamlets of the array of primary beamlets can be adjusted at the collimator.

According to yet further embodiments, which can be combined with other embodiments described herein, one or more further aperture arrays 140 can be provided. For example, FIG. 7A shows a first aperture array 140 downstream of the collimator 130 and a second aperture array 740 upstream of the collimator 130. According to some embodiments, which can be combined with other embodiments described herein, aperture arrays can be provided on both sides of the collimator. As exemplarily shown in FIG. 7A, the number of openings in the aperture array 140 and/or the aperture of an array 740 is smaller as compared to the number of aperture openings in the multi-aperture lens plate 122. As described above with respect to FIG. 5A, aperture openings 522 for primary beamlets and dummy apertures 524 can be provided. The dummy apertures reduce aberrations of the ALA. The dummy apertures are not intended for generating primary beamlets impinging on the specimen. Accordingly, the aperture array 740 may include portions blocking the charged particle beams passing through the dummy apertures 524. Accordingly, the multi-aperture lens plate includes more openings as compared to the number of openings in the one or more further aperture arrays or as compared to the openings in the deflector array of the collimator.

FIG. 7A illustrates yet further embodiments, which may be combined with other embodiments described herein, particularly embodiments having an alignment system 710. The aperture array 740 includes a conductive material 742. The conductive material 742 or conductive surfaces allow to measure a current potentially provided by impingement of primary beamlets on the aperture array. The current can be measured with the current meters 744. Accordingly, a misalignment of one or more primary beamlets with respect to the collimator 130 can be detected based on charged particles impinging on the conductive material. The measured current of zero corresponds to all primary beamlets being guided through the openings in the further aperture array 740. According to some embodiments, which can be combined with other embodiments described herein, the alignment system 710 may allow for 4 degrees of freedom adjustment, for example, based on the current measurement. A deflection in the x-direction, a deflection in the y-direction, a rotation around the z-axis and a pitch adjustment by quadrupole fields can be provided.

According to yet further embodiments, the conductive material 742 or conductive surfaces can include segments or portions of conductive material, wherein each segment or portion corresponds to an individual opening in the aperture array or a pattern of openings in the aperture array, for example, a row or column. Accordingly, a capability to measure a current for individual openings or a pattern of openings may serve for further improved alignment of the primary beamlets with the alignment system 710.

Figure 24A:
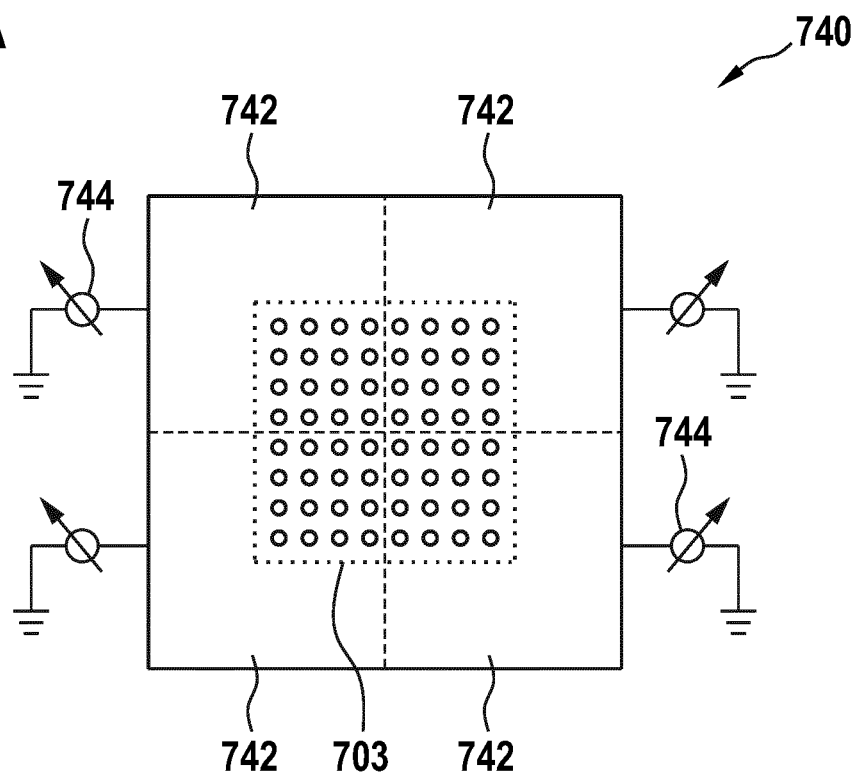
FIGS. 24A and 24B show schematic views of aperture arrays having conductive surfaces for current measurement according to embodiments described herein.

Further implementations of current measurement on an aperture plate, particularly for alignment of the primary beamlets with an alignment system described with respect to FIGS. 7A to 7C, can be described with reference to FIGS. 24A and 24B. FIG. 24A shows an aperture array 740. A plurality of aperture openings are provided in the aperture array and forming an array of openings indicated by dashed line 703. The aperture has a plate and conductive surfaces or areas of conductive material 742 are provided on the plate. FIG. 24A illustrates four conductive surfaces as indicated by the dashed lines. The four conductive surfaces can be insulated from each other. Current meters can be connected to the conductive surfaces. A well aligned array of primary beamlets passes through the openings in the aperture array. Accordingly, no current from the charger particles of the primary beamlets is generated for a well aligned array. Depending on the number of primary beamlets impinging on a conductive surface, i.e. conductive material 742, a current in a current meter 744 increases. Accordingly, the higher the number of primary beamlets impinging on the conductive surface, the higher the current.

According to some embodiments, which can be combined with other embodiments described herein, a conductive material 742 on an aperture array 740 can be segmented, for example, four conductive surfaces can be provided. Upon control of the alignment system, wherein one or more primary beamlets move relative to the openings of the aperture array, the current in one or more current meters 744 varies. According to an embodiment described with respect to FIG. 24A, a segmentation of the conductive material and having current meters connected to the segments of the conductive material allows to determine different currents for each of the current meters. Accordingly, moving the array of primary beamlets, for example, to the right side in FIG. 24A may increase the current reading on the current meters on the right-hand side. Evaluating the differences for the different segments allows for determining a plurality of positions of primary beamlets relative to the openings in the aperture array for a given set of control parameters of the alignment system. By varying the control parameters of the alignment system, i.e. the scanning of the primary beamlets over the surface of the aperture array, adapting the pitch between primary beamlets, and/or rotating the array of primary beamlets current readings can be provided for different control parameters. The orientation, position, and/or shape of the array of primary beamlets can be determined. The control parameters can be set to develop an aligned array of primary beamlets, wherein all primary beamlets pass through the openings of the aperture array.

According to another implementation, which may additionally or alternatively be provided, one or more conductive surfaces can be provided on the aperture plate and outside of the array of openings indicated by dashed line 703.

For example, a conductive surface may be provided adjacent to one corner of the array of openings. Exemplarily, this may be the upper right conductive surface or corresponding conductive material 742 shown in FIG. 24B. FIG. 24B further shows a highlight of the upper right primary beamlet. Scanning the array of primary beamlets as indicated by arrow 749 can direct the upper right primary beamlet on the conductive surface, for example, the conductive surface adjacent to the corresponding corner of the array of primary beamlets. A current can be measured with the current meter 744. Thus, the amount of deflecting of the array of primary beamlets can be determined by scanning the array of primary beamlets such that current can be detected. A corresponding deflection can be provided for several primary beamlets, particularly primary beamlets at the corners of the array of primary beamlets.

Figure 24B:
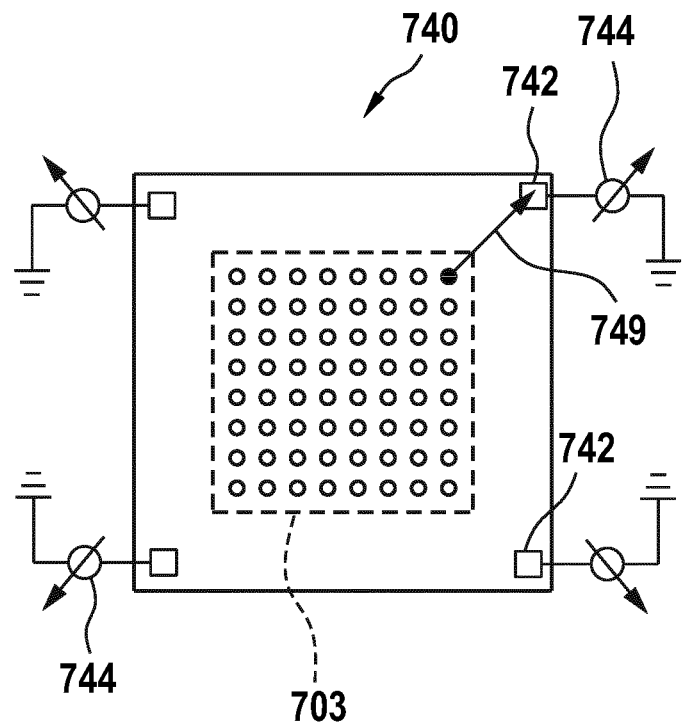

Scanning each of the corners, for example, the four corners of the array shown in FIG. 24B on a conductive surface, allows for determining a position for each corner. According to embodiments described herein, the scanning can be provided such that the according beamlet impinges on the conductive surface before other beamlets impinge on the conductive surface. According to one embodiment, two or more corner beamlets can be guided on the same conductive surface. According to an alternative embodiment, each corner beamlet can be guided to a different conductive surface. For example, with reference to FIG. 24B, each corner beamlet can be guided on the conductive material 742, i.e. a corresponding conductive surface adjacent to the respective corner.

According to some embodiments, which can be combined with other embodiments described herein, determining control parameters of the alignment system for at least three corners allows for evaluating, the scanning position of the array of primary beamlets, a potential distortion of the array of primary beamlets, and the potential rotational orientation of the array of primary beamlets. Accordingly, according to embodiments of the present disclosure, a combination of an alignment system 710 and one or more current meters connected to one or more conductive surfaces on an aperture array allows for proper alignment of the array of primary beamlets with respect to the aperture array.

Figure 25:
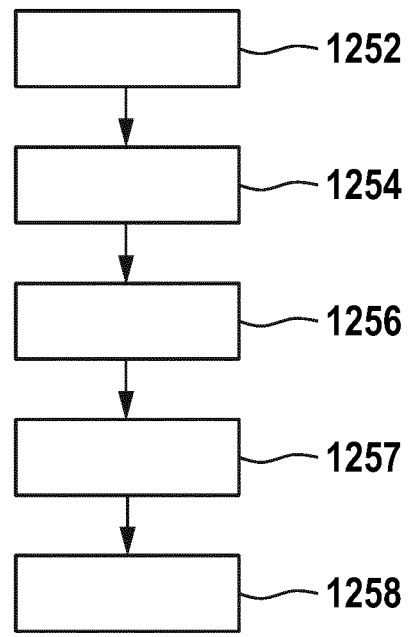
FIG. 25 shows a flow chart illustrating methods of aligning an array of primary beamlets according to embodiments of the present disclosure.

FIG. 25 shows a flow chart showing a corresponding method of aligning an array of primary beamlets. At operation 1252 a primary charged particle beam is generated with a charged particle source. At operation 1254 the four or more primary beamlets are generated with a multi-aperture lens plate and two or more electrodes. The method of aligning an area of primary beamlets is described herein with respect to implementations, wherein a single source generates a primary charged particle beam and primary beamlets are generated by an aperture lens array. According to yet further embodiments, which can be combined with other embodiments described herein, an alignment of an array of primary beamlets may equally be provided for an array of primary beamlets generated by an array of a charged particle beam source.

At operation 1256, a first primary beamlet, a second primary beamlet, a third primary beamlet, and a fourth primary beamlet of the four or more primary beamlets are deflected with respect to each other with a collimator. At operation 1257, an alignment system upstream of the collimator is controlled to scan the four or more primary beamlets over openings in an aperture array. Further, at operation 1258 a current at one or more conductive surfaces is measured on the aperture array.

According to embodiments described with respect to FIG. 24A, the alignment system can be controlled to minimize the current at the one or more conductive surfaces. For example, the one or more conductive surfaces can be provided between the openings in the aperture array. Additionally or alternatively, as described with respect to FIG. 24B, the alignment system can be controlled to increase a current at one or more conductive surfaces. In such an implementation the one or more conductive surfaces are provided outside of an opening array formed by the openings in the aperture array. According to yet further embodiments, which can be combined with other embodiments described herein, after an alignment of the array of primary beamlets relative to the aperture array, the primary beamlets or at least a portion of the primary beamlets may reach the specimen and signals from the signal beamlets can be measured. The array of primary beamlets can be further aligned downstream of the aperture array by increasing the signals of the signal beamlets. For example, the further alignment can be provided by the alignment system and/or adjustment of individual deflection of the primary beamlets in the collimator.

Four methods of aligning an array of primary beamlets, a controlling of the alignment system may include one or more of the following control procedures: a) scanning the four or more primary beamlets with a deflection field, particularly one deflection field, in at least a first direction in a plane of the aperture plate; b) scanning the four or more primary beamlets in a second direction perpendicular to the first direction in the plane of the aperture plate; c) adapting a pitch between the four or more primary beamlets with a quadrupole field in at least a third direction in a plane of the aperture plate; d) adapting a pitch between the four or more primary beamlets with a quadrupole field in at least a fourth direction in a plane of the aperture plate; e) rotating an array formed by the four or more primary beamlets in the plane of the aperture plate. The control procedures a) and/or b), control procedures c) and/or d) and control procedure e) can be sequentially performed. Additionally, the control procedures can be sequentially performed in an iterative manner.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. According to some embodiments, the collimator is provided between a first aperture array of one or more aperture arrays and a second aperture array of the one or more aperture arrays, and particularly a current meter attached to at least one aperture array of the one or more aperture arrays. Accordingly, beam adjustment of the primary beamlets at the collimator can be measured. Further, a first aperture array above the collimator and a second aperture array below the collimator allows for limitation of the fields, for example, the electrostatic fields of the collimator. Yet further, additionally or alternatively, an aperture array and the corresponding holder of an aperture array may serve as a vacuum separation between vacuum compartments. Openings in an aperture array may serve as pumping apertures.

Figure 11:
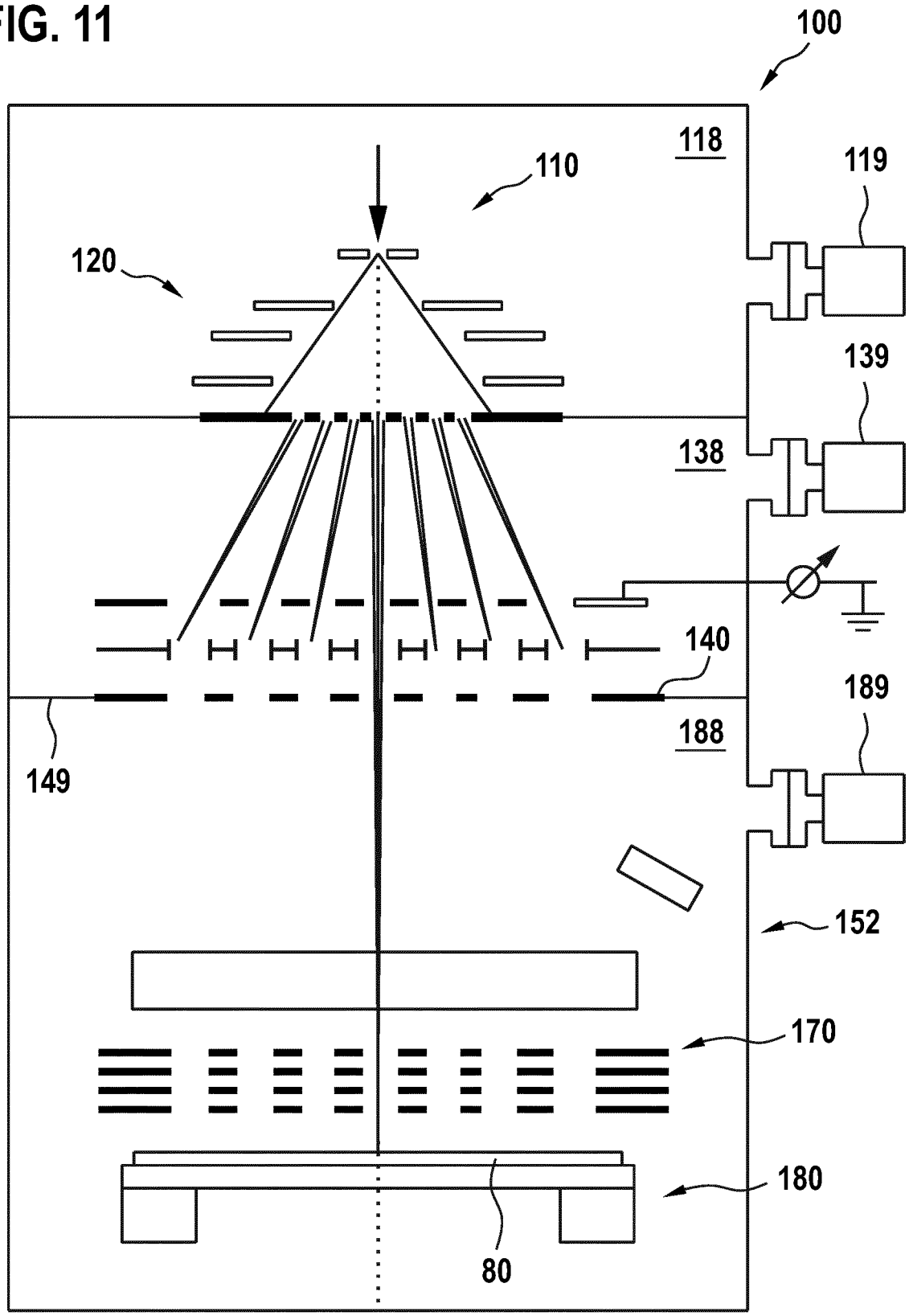
FIG. 11 shows a schematic view of a charged particle beam device according to embodiments of the present disclosure.

According to yet further embodiments, which can be combined with other embodiments described herein, at least one of the one or more further aperture arrays can be provided to separate the vacuum in neighboring vacuum compartments. FIG. 11 shows a charged particle beam device 100. The charged particle beam source 110 is provided in a first vacuum compartment 118. The vacuum pump 119 is provided in fluid communication with the vacuum compartments 118. The vacuum pump 119 evacuates the vacuum compartment 118. In the example shown in FIG. 11, the aperture lens array or multi-aperture lens plate, respectively, is provided in the vacuum compartment 118. According to yet further embodiments, two vacuum compartments may be provided instead of the vacuum compartment 118. Accordingly, the charged particle beam source 110 and the aperture lens array may be provided in separate compartments.

As shown in FIG. 11, a second vacuum compartment 138 can be provided. For example, the collimator 130 can be provided in the second vacuum compartment 138. According to yet further modifications, the aperture lens array may also be provided in the second vacuum compartment 138. The vacuum pump 139 is provided in fluid communication with the second vacuum compartment 138. The vacuum pump 139 evacuates the vacuum compartment 138.

According to some embodiments, which can be combined with other embodiments described herein, a holder 149 for the further aperture array 140 is provided. The holder 149 and, particularly the holder 149 and the aperture array 140 separates the second vacuum compartment 138 from a third vacuum compartment 188. Accordingly, differential pumping of different vacuum compartments cannot be provided on opposing sides of the holder and/or the further aperture array 140, respectively.

The third vacuum compartment 188 is in fluid communication with the vacuum pump 189. The third vacuum compartment may include the objective lens unit 170. Further, the stage 180 may be provided in the third vacuum compartment 188. According to some embodiments, which can be combined with other embodiments described herein, at least three vacuum compartments can be provided in the charged particle beam device 100. Two neighboring vacuum compartments may be separated from each other by a further aperture array and/or a holder for the further aperture array. Having three or more vacuum compartments allows for regions of different pressure within the column of the charged particle beam device 100.

Embodiments of charged particle beam devices according to the present disclosure provide for illumination of a specimen or inspection of a specimen with a plurality of primary beamlets, wherein the primary beamlets are generated from a single charged particle beam source, for example, with an ALA. According to yet further embodiments, which can be combined with other embodiments described herein, the primary beamlets travel through the charged particle beam device without a crossover of the first primary beamlet of the array of primary beamlets with a second primary beamlet of the array of primary beamlets, particularly without a crossover of the primary beamlets generated in the charged particle beam device. Avoiding the crossover avoids interaction between the primary beamlets. Higher beam currents can be provided for the primary beamlets.

Beam Separation And Detection (Internal: Box 250)

Figure 12:
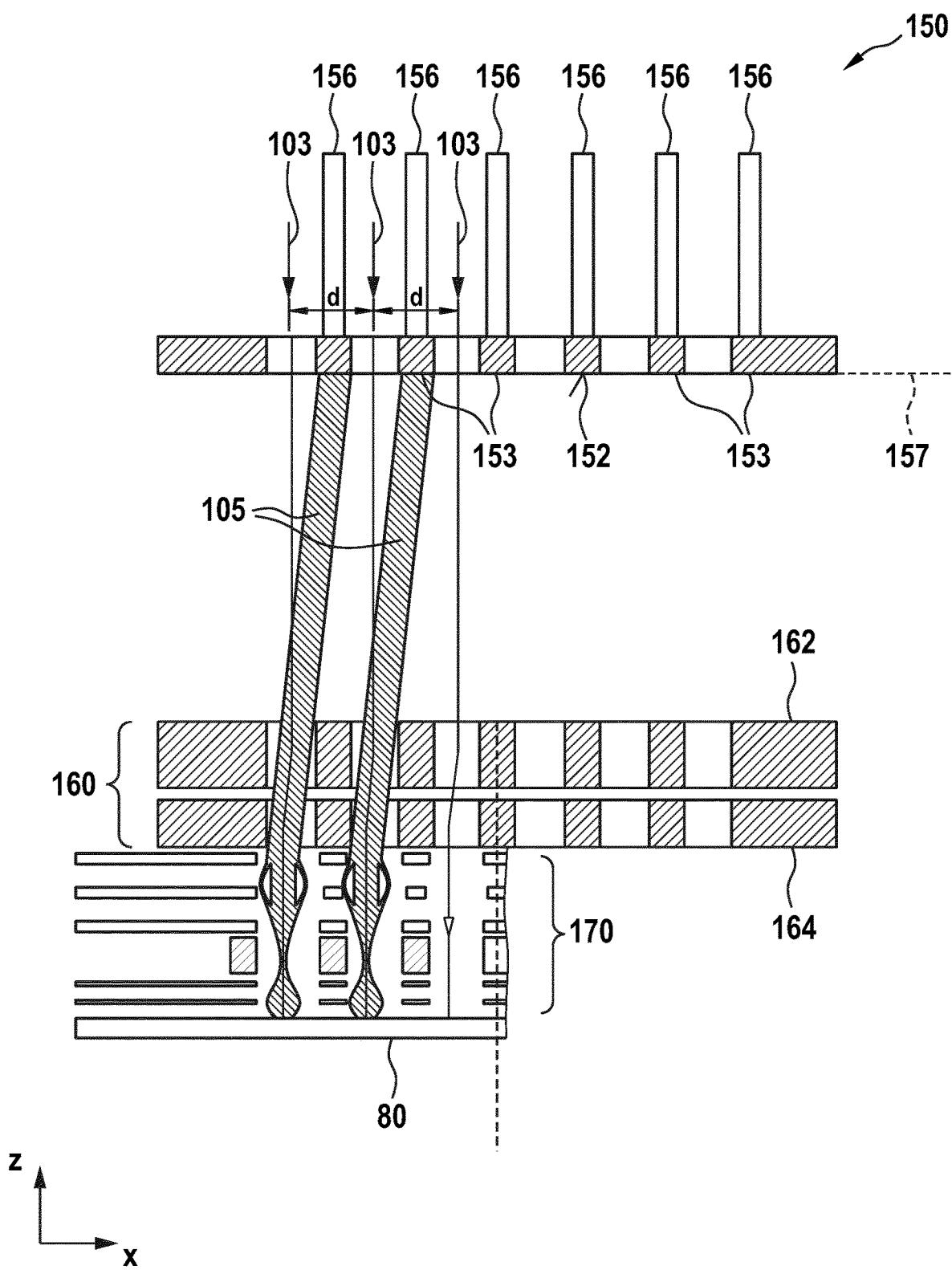
FIG. 12 shows a schematic view of a portion of a charged particle beam device according to embodiments of the present disclosure, wherein the detection unit and a beam separation unit is described.

With reference to box 250 in FIG. 2, a beam separation unit 160 and detection unit 150 is described in further detail below. The beam separation unit 160 separates primary beamlets from the one or more signal beamlets. The signal beamlets are detected by the detection unit 150. FIG. 12 shows the specimen 80. The primary beamlets 103 impinge on the specimen 80. Upon impingement of the primary beamlets 103, signal beamlets 105 are generated. The primary beamlets 103 and the signal beamlets 105 are separated by the beam separation unit.

According to some embodiments, which can be combined with other embodiments described herein, the beam separation unit can be a Wien filter array having a magnetic deflector 162 and an electrostatic deflector 164. A deflection of the primary beamlets by the magnetic deflector 162 is provided in a direction opposite to a deflection direction of the electrostatic deflector 164. Accordingly, the beam path of the primary beamlets before and after the beam separation unit is parallel or substantially parallel. In an arrangement as exemplarily shown in FIG. 12, wherein the magnetic deflector 162 and the electrostatic deflector 164 act in different planes along optical axes of the primary beamlets, a shift of the primary beamlets may occur. In arrangements, in which the fields of the magnetic deflector and the electrostatic deflector overlap, the primary beamlets may be substantially undeflected.

The primary beamlets 103 are focused on the specimen 80 by the objective lens unit 170. Signal beamlets 105 travel through the objective lens and in the direction substantially opposite to the direction of the primary beamlets 103. Accordingly, the Wien filter array deflects the signal beamlets 105. The deflection of the Wien filter array is based on the change of deflection direction of the magnetic deflector 162. Accordingly, the magnetic deflector 162 and the electrostatic deflector 164 act in the same direction for the signal beamlets 105.

The beam separation unit may also be considered an electro-magnetic deflection system for separation of primary and signal beamlets. For example, the signal beamlets can be deflected by an angle of 1° to 20°, particularly by an angle of 3° or below.

Figure 13:
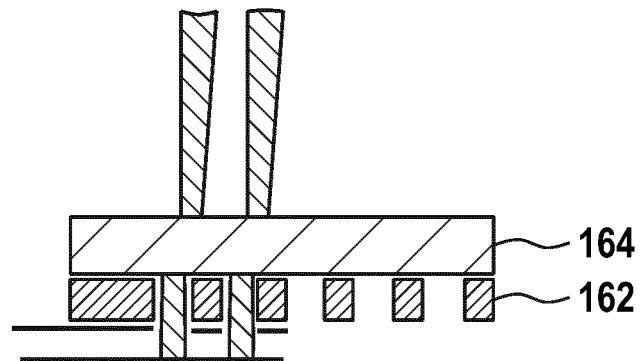
FIG. 13 shows a schematic view of a beam separation unit according to embodiments of the present disclosure.
Figure 14A:
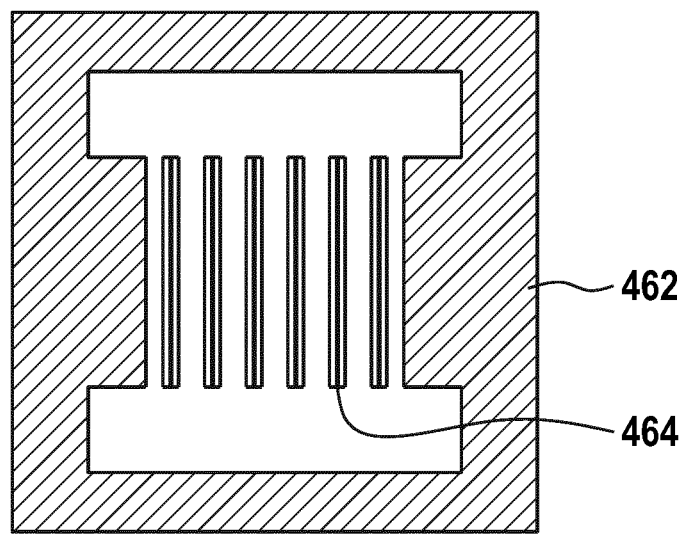
FIGS. 14A and 14B show a schematic top view and the schematic side view, respectively, of a magnetic deflector of a beam separator according to embodiments of the present disclosure.
Figure 14B:

Considering a rectangular array or square array of primary beamlets, an electro-magnetic deflection system, for example, a Wien filter array, can be provided as exemplarily shown in FIGS. 13, 14A and 14B. The electrostatic deflector 164 can be provided by two or more elongated deflection electrodes. The deflection electrodes can, for example, be parallel to the paper plane in FIG. 13. Deflection electrodes may be provided on opposing sides of the array of primary beamlets. Further deflection electrodes may be provided between rows of primary beamlets. For example, having an array of primary beamlets with M (M>=1) rows of primary beamlets, M+1 electrodes can be provided. The electrodes are elongated to deflect the primary beamlets of one row.

The magnetic deflector 162 can be provided by an array of coils. The coils 464 can be provided on a core 462. The coils 464 can be provided along the line and may be elongated in a direction perpendicular to the line. The coils can be elongated to deflect the primary beamlets of one row. According to some embodiments of the present disclosure, a row of primary beamlets of the array of primary beamlets can pass between two neighboring coils of the array of coils. Having an array of primary beamlets with N (N>=1) rows of primary beamlets, N+1 coils can be provided. For example, the coils can be wound on a magnetic core having, for example magnetic material forming a magnetic circuit to close the magnetic flux lines.

Figure 15:
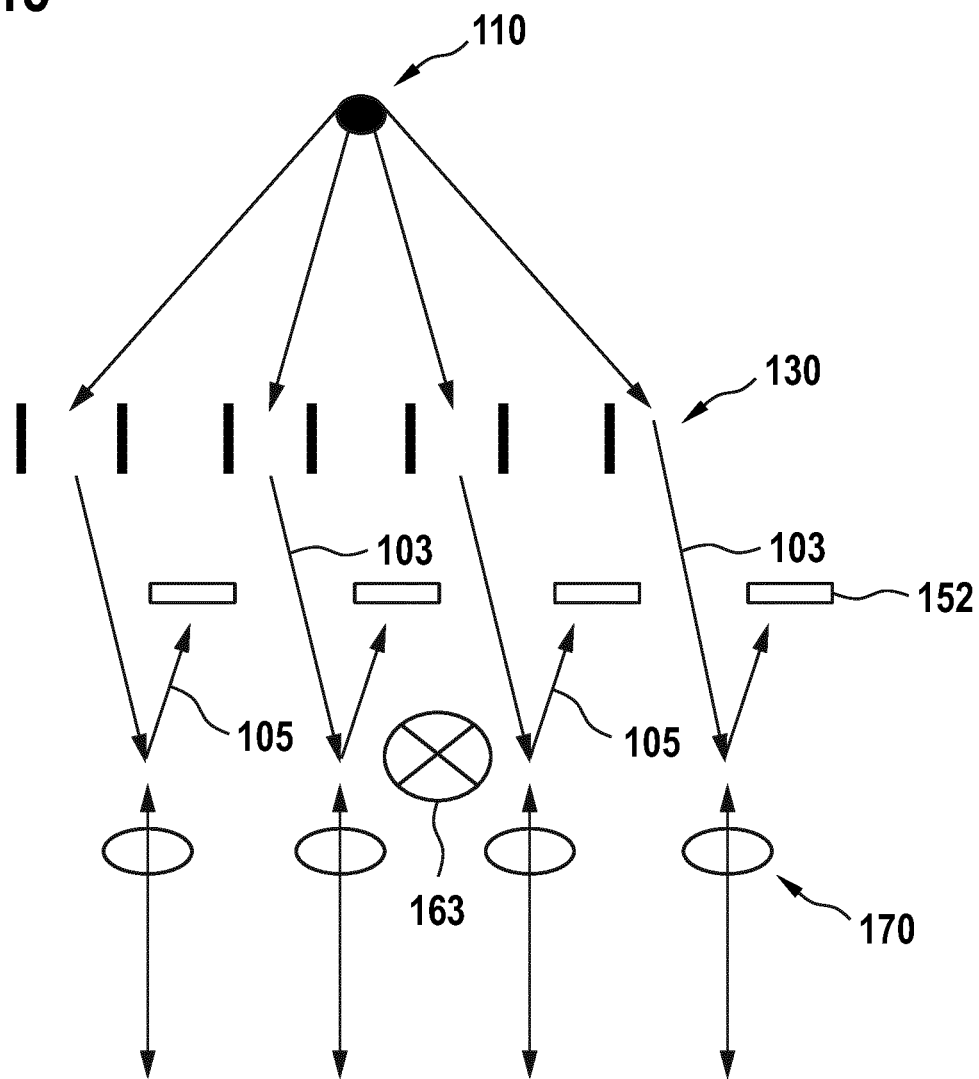
FIG. 15 shows a schematic view of a beam separation unit according to embodiments of the present disclosure.

FIG. 15 illustrates a yet further embodiment of a beam separation unit 160. The beam separation unit may be provided by the magnetic field 163. For example, the magnetic field 163 may be provided by an array of coils 464 as shown in FIGS. 14A and 14B. The collimator 130 can be operated to guide the primary beamlets 103 at an angle relative to the optical axes of an objective lens unit. The beam separation unit may deflect the primary beamlets to be parallel or essentially parallel to the optical axes of the objective lens unit 170. The signal beamlets being guided upwards in the charged particle beam device are separated from the primary beamlets by the magnetic field 163 of the beam separation unit 160.

Figure 16A:
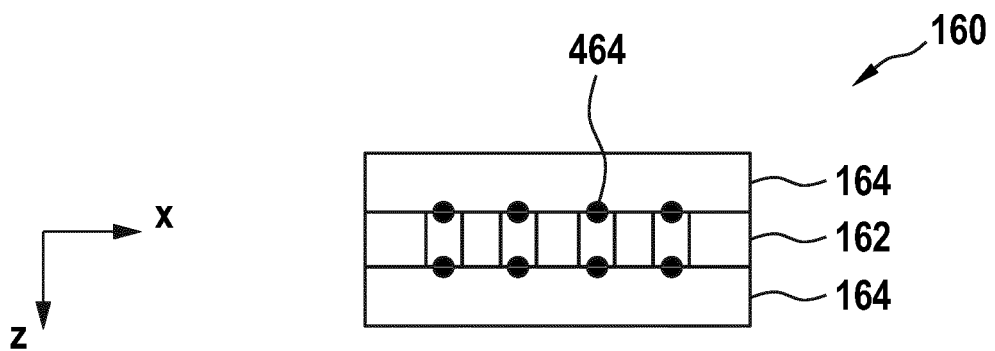
FIGS. 16A to 16C show schematic views of a yet further beam separation unit according to embodiments of the present disclosure.
Figure 16B:
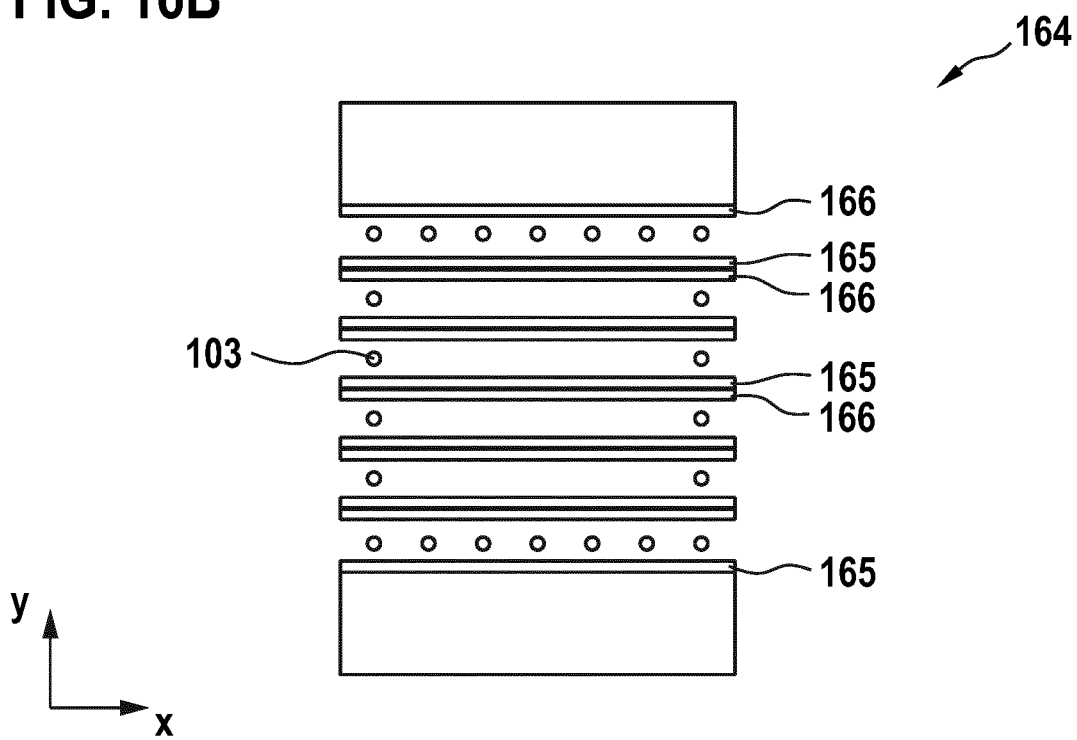
Figure 16C:
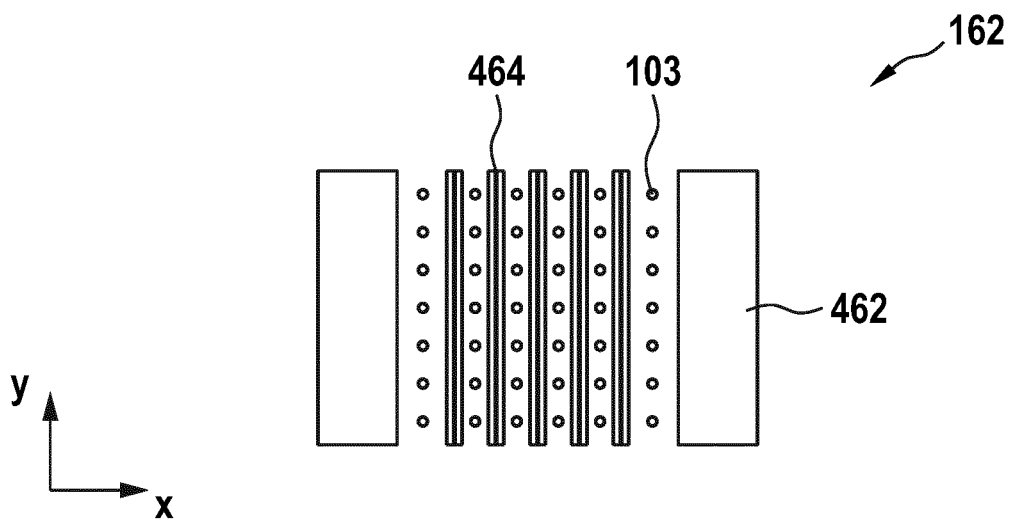

A beam separation unit 160 according to yet further embodiments is shown in FIGS. 16A to 16C. Three layers, for example, of magnetic material, are provided. The magnetic material can be a high magnetic permeability material and the layers may form a magnetic circuit. A first electrostatic deflector 164 is provided as shown in FIG. 16A. A magnetic deflector 162 is provided. A second electrostatic deflector 164 is provided. The magnetic deflector 162 can be provided between the first electrostatic deflector and the second electrostatic deflector. Embodiments of the present disclosure referring to the magnetic deflector or an electrostatic deflector may also be referred to as a magnetic deflector array or an electrostatic deflector array, respectively. The magnetic deflector 162 and the one or more electrostatic deflectors 164 are configured to deflect an array of primary beamlets and/or signal beamlets. For example, an array can be formed as a one-dimensional array of electrodes as described herein.

The first electrostatic deflector 164 and the second electrostatic deflector 164 include at least two electrodes between rows of the array of primary beamlets. The at least two electrodes can be a first electrode 165 and a second electrode 166. The first electrode 165 can be at a positive potential and the second electrode 166 can be at a negative potential, or vice versa. The at least two electrodes provide electrostatic deflection fields for rows of the array of beamlets. According to some embodiments of the present disclosure, which can be combined with other embodiments described herein, the at least two electrodes can be allocated electrodes or strip electrodes. Further, additionally or alternatively, the at least two electrodes can be provided between rows of the array of primary beamlets.

The magnetic deflector 162 (or the magnetic deflector array) includes one electrode, for example, an elongated electrode or strip electrode, between rows of the array of primary beamlets. The one electrode of the magnetic deflector is surrounded by a coil. For example, the coil may have an insulated wire. The one electrode may also be referred to as or can provide a core for the magnetic field generation.

Embodiments of the present disclosure refer to an array of primary beamlets and an array of signal beamlets, respectively. The present disclosure refers to rows (instead of rows and columns) irrespective of whether a row is provided in x-direction or in y-direction. It is understood that a row of an array may extend in the first direction and further, a row may extend in a second direction, perpendicular to the first direction. From the characteristics of the electro-optical components, persons skilled in the art can well understand the orientation of the term "row" when utilized herein for describing the array of primary beamlets and/or secondary beamlets.

By providing the three layers of electrodes a magnetic circuit is formed. Further, a symmetric arrangement along the direction of the optical axes of the beamlets is provided.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. The charged particle beam device can include a detection unit having detection surfaces. One or more detection surfaces are arranged between beam paths of the four or more primary beamlets. For example, the detection surfaces may convert the signal beamlets in photons and four or more photo detectors are provided for the detection unit. The beam separation unit can include a first electrostatic deflector, a second electrostatic deflector, and a magnetic deflector provided between the first electrostatic deflector and the second electrostatic deflector, wherein optionally the first electrostatic deflector, the second electrostatic deflector, and the magnetic deflector form a magnetic circuit. As a yet further optional additional or alternative feature, the first electrostatic deflector and the second electrostatic deflector each includes at least two elongated electrodes between rows of the four or more primary beamlets. Accordingly, a symmetric beam separation unit can be provided.

Returning now to FIG. 12, the array of primary beamlets 103 can have a distance d. The pitch may be 200 µm and above, particularly 400 µm or above. At least a first pitch between the primary beamlets can be provided along the first direction, for example, the x-direction. The electrodes of electrostatic deflector 164 and/or the core or electrodes of the magnetic deflector 162 can have a pitch similar to the first pitch. For example, the pitch of the electrodes can be within the first pitch +−10%. Yet further, according to some embodiments, which can be combined with other embodiments described herein, a beam separation between the primary beamlets and the signal beamlets can be provided with a distance of 10% to 90% of the first pitch between the primary beamlets, particularly in the plane of the signal detection of the signal beamlets.

As described above, a charged particle beam device 100 includes a beam separation unit 160. The beam separation unit 160 separates the primary beamlets 103, i.e. primary charged particle beamlets, from the signal beamlets 105 (shown in FIG. 12). According to some embodiments, the beam separation unit can, for example, include at least one magnetic deflector, a Wien filter, or any other electro-optical component, wherein the electrons are directed away from the primary charged particle beamlets beam, e.g. due to the velocity depending on Lorenz force.

The beam separation unit can be provided between the objective lens unit 170 and the detection unit 150. The detection unit 150 includes a plurality of detectors or detection surfaces 152. The detection unit may include a plurality of conversion units 153 converting the signal beamlets into photons. Particularly the conversion units 153 can be electron-photon conversion units. The conversion units 153 may include the detection surfaces 152 and, particularly, an array of fluorescent stripes. The array of fluorescent stripes can be provided in the plane of the conversion unit 153 and next to a primary beamlet or a row of primary beamlets. For example, the pitch of the array of fluorescent stripes can be similar to the distance d or the first pitch of the primary beamlets. The primary beamlets 103 can pass through the fluorescent strips of the conversion unit or the array of fluorescent strips, respectively. According to some embodiments, which can be combined with other embodiments described herein, the pitch of the primary beamlets 103, i.e. the distance d, the pitch of the fluorescent strips, and the pitch of the signal beamlets 105 in the plane 157 of the detection surfaces 152 can be the same or essentially the same. The signal beamlets are deflected by the beam separation unit to travel at an angle with respect to the optical axes of the objective lens unit in order to project the signal electrons onto the fluorescent strips or the detection surfaces 152 of the electron-photon converter unit 81, as schematically shown in FIG. 12.

According to some embodiments, which can be combined with other embodiments described herein, at least one fluorescent strip of said array of fluorescent strips is arranged between two adjacent rows of primary beamlets.

According to some embodiments described herein, the detection surfaces are arranged for projecting the signal beamlets, i.e. signal electrons, to one side next to the primary charged particle beamlets. Accordingly, an overlap of the spots of signal electrons from adjacent primary charged particle beamlets can be reduced or prevented, which makes it easier to detect and distinguish the signal beamlets resulting from adjacent primary beamlets. Accordingly, the detection and evaluation of the signal beamlets from the surface of the sample can be faster, which increase the throughput for the inspection of samples.

In the example shown in FIG. 12, the conversion units, for example, electron-photon conversion units, are arranged in a series of parallel arranged fluorescent strips which extend substantially in the Y-direction. According to yet further embodiments, electron-photon conversion units or detection surfaces may be provided at a plate with through holes for the primary charged particle beamlets. The plate may extend in the XY direction. Detection surfaces or fluorescent portions may be provided at the plate or the plate may include a fluorescent material. The parts of such a plate or the fluorescent material on portions of the plate, which extends in the X or Y direction in between the through holes, are also considered to be fluorescent strips in accordance with the present disclosure.

At the conversion units 153 photons are generated upon incidence of the signal beamlets. The photos can be generated by fluorescent strips or portions. At least a part of the photons are guided from the conversion units to photo detectors. The photons can be guided by, for example, optical fibers 156. A first end of the optical fiber can be arranged adjacent to, coupled to or attached to the conversion unit. Light, i.e. photons, is coupled into the optical fiber. A second end of the optical fiber can be provided at the photo detector. The optical fibers can be provided as an array corresponding to the array of signal beamlets. A row of the array of optical fibers can be provided between a row of the array of primary beamlets. For example, the array of optical fibers can be provided between the array of primary beamlets in one of the x-direction and the y-direction.

According to some embodiments, which can be combined with other embodiments described herein, an array of fluorescent strips is provided, wherein each fluorescent strip is located adjacent to a primary beamlet. For example, the fluorescent strips can be located with a distance equal to the pitch of the primary beamlets in the plane 157 of the detection surfaces 152. An array of optical fibers or glass fibers are provided for transporting the generated light to photo detectors, e.g. an array of photodetectors.

According to some embodiments, which can be combined with other embodiments described herein, the detection surfaces 152, i.e. surfaces of the conversion units 153, on which signal particles impinge, can include conductive material. For example, a conductive material can be coated on the detection surfaces. The conductive material allows for removal of charge generated on the detection surfaces.

Figure 17:
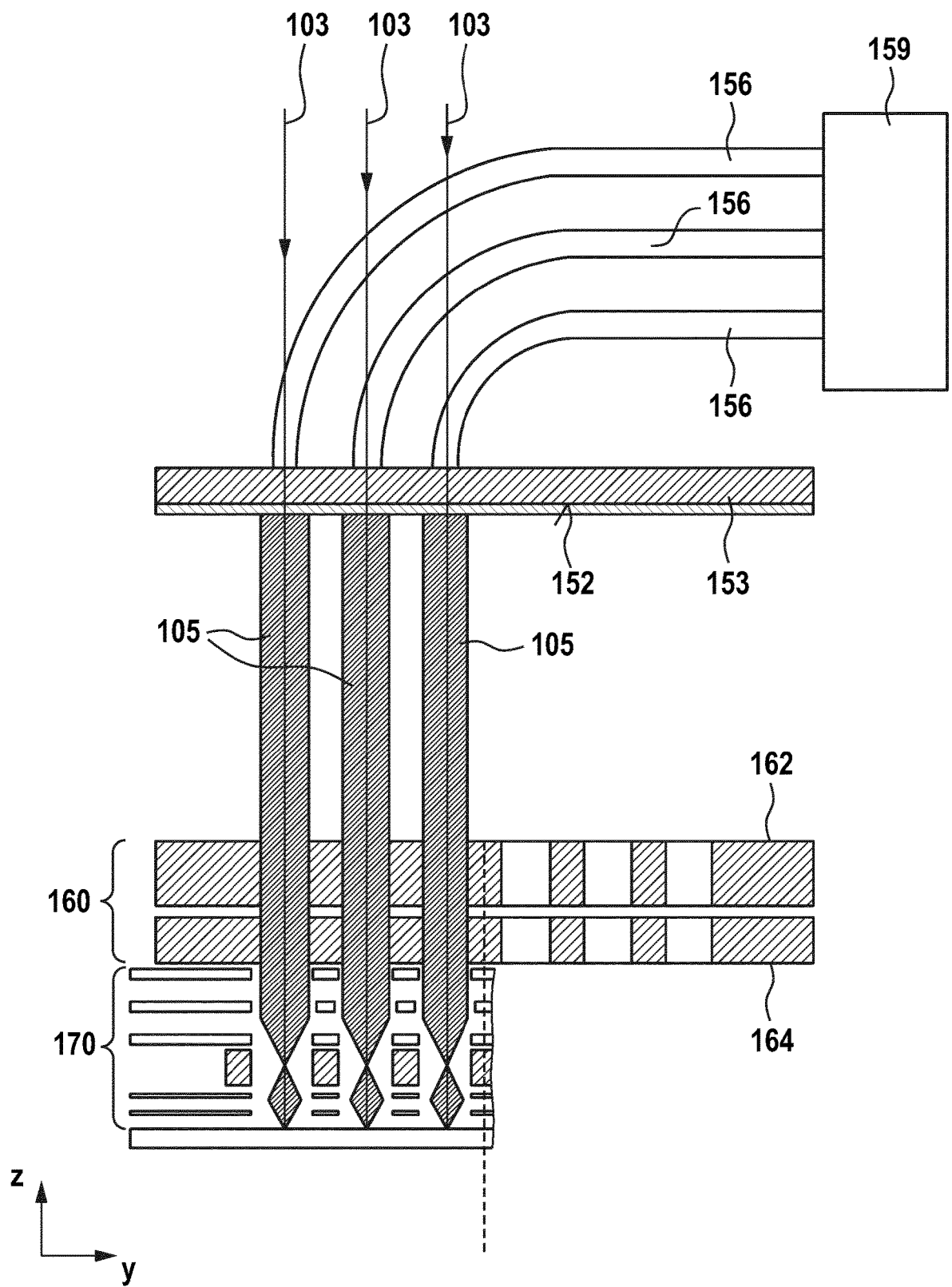
FIG. 17 shows a schematic view of a portion of a charged particle beam device according to embodiments of the present disclosure, wherein a detection unit is described.

While FIG. 12 illustrates beam separation and detection in the XZ plane, FIG. 17 shows a corresponding arrangement in the YZ plane. As can be seen, optical fibers 156 can be provided to guide photons from the conversion units to a photo-detector array 159. The optical fibers can be provided between rows of the array of primary beamlets.

The photo-detector array, such as a multi-sensor detector system, can be arranged at a position which is spaced apart from the array of primary beamlets, for example, in a direction perpendicular to an optical axes of the primary beamlets. The detection unit can include an array of fluorescent strips, wherein each strip is located next to a primary beamlet or a row of primary beamlets. For example, the fluorescent strips can be located within a distance equal to a pitch of the primary beamlets in the plane of the detection surfaces. According to some embodiments, the fluorescent strips can be arranged close to the primary charged particle beamlets. Preferably, at least one strip of said array of fluorescent strips is arranged between two adjacent primary beamlets. By arranging fluorescent strips close to a primary beamlet or even between two adjacent primary beamlets, the width of the multi-beam charged particle column can be reduced. This enables easier arrangement of multiple multi-beam charged particle columns close to each other and to arrange more multi-beam charged particle columns within a certain area above the sample. Accordingly, the surface of the sample can be inspected more quickly, which increase the throughput for the inspection of samples.

According to some embodiments, which can be combined with other embodiments described herein, a photo detector array can include a plurality of photo detectors, particularly at least one photodetector per signal beamlet or optical fiber, respectively. For example, a photo detector may be a photo diode or another electro-optical element including a p-n junction. Additionally or alternatively, a photo detector may include a photo multiplier. An electrical signal is generated by the photo detector. Particularly, the array of photo detectors allows for generation of an electrical signal per signal beamlet.

Figure 18:
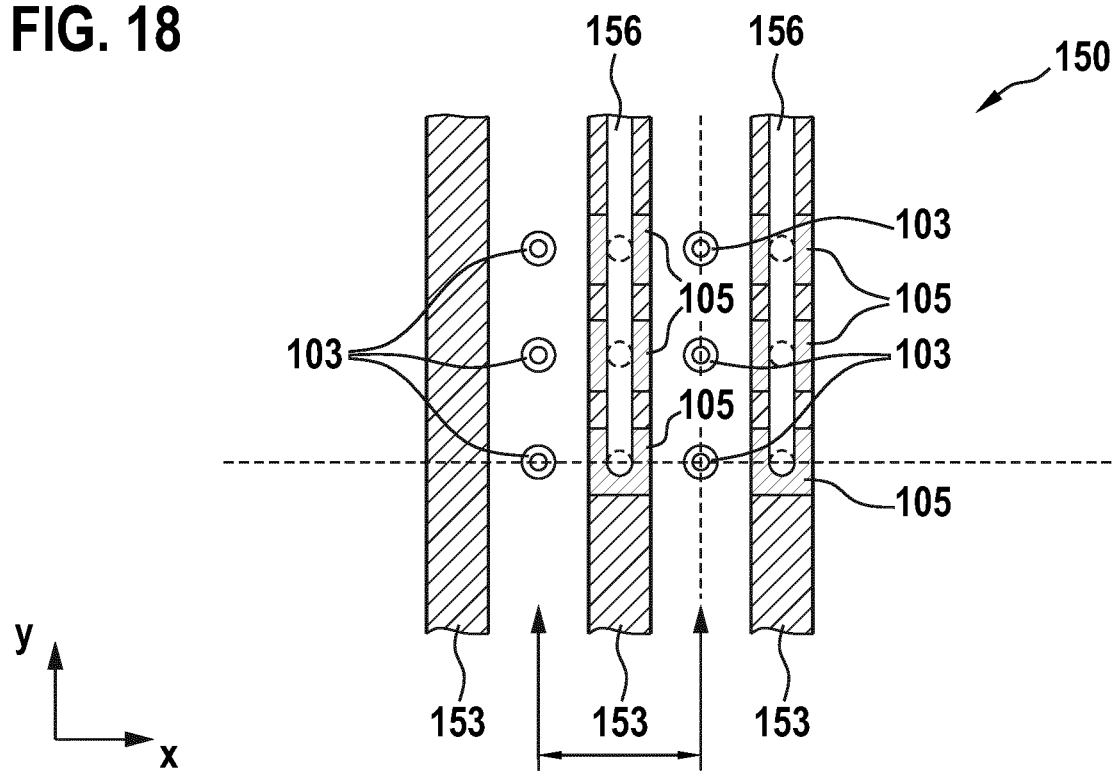
FIG. 18 shows a schematic top view of the detection unit shown in FIG. 17.

FIG. 18 shows a schematic top view at the plane of the conversion units 153, e.g. electron-photon converter units. As shown in FIG. 17, the primary beamlets 103 are arranged in multiple rows, wherein each row extends in a first direction, in FIG. 17 in the Y-direction. The rows of primary beamlets 103 are arranged next to each other in a second direction, in FIG. 17 in the X-direction. The fluorescent strips of the conversion units 153, are arranged next to a row of primary beamlets and, for example, with a distance equal to a pitch of the rows of the primary beamlets at the conversion units 153 or the detection surfaces, respectively. Openings or gaps between the fluorescent strips are arranged to allow passage of the primary beamlets through the plane of the detection surfaces.

Signal beamlets 105 generated upon impingement of the primary beamlets on the specimen are deflected by the beam separation unit, for example, in the x-direction in FIG. 18. The signal beamlets impinge on the detection surfaces, i.e. the fluorescent stripes or portions of the conversion units. The detection surfaces are on the side facing the beam separation unit. The conversion units convert the signal beamlets into photons (light) using the fluorescent material. At a side opposing the detection surfaces, optical fibers 156 can be provided to collect the generated photons or at least a portion of the generated photons.

The optical fibers 156, which are arranged to collect the photons from the various spots of the signal beamlets on a specific fluorescent strip, are arranged above said fluorescent strip, in particular in the ZY plane in FIG. 18. As schematically shown in FIG. 17, the optical fibers 156 are bent or curved in the YZ plane in order to arrange the second end of the fibers at the photo-detector array 159.

Figure 19:
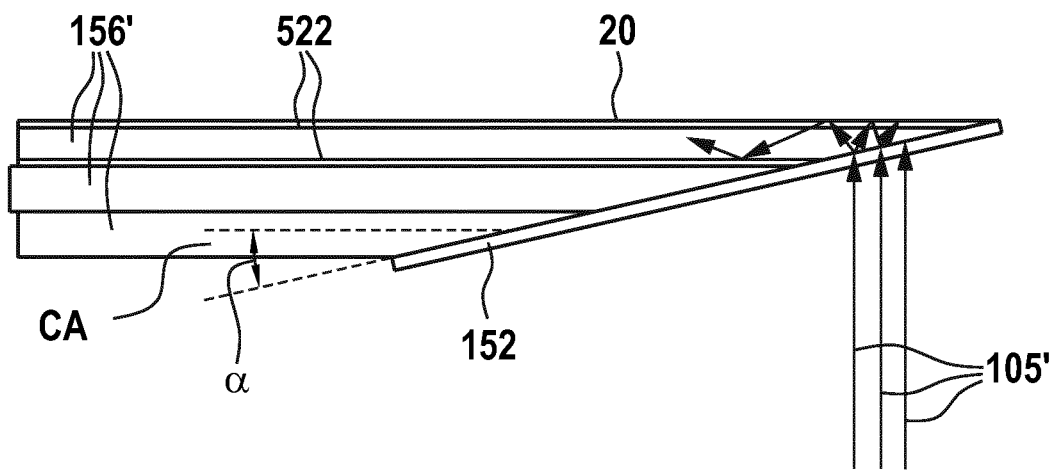
FIG. 19 shows a schematic view of a yet further detection unit according to embodiments of the present disclosure.

As an alternative to the curved or bent optical fibers 156 shown in FIGS. 17 and 18, the optical fibers 156' are tapered at the detection surface 152. The first end of the optical fibers 156' can be cut at an angle a between 10° and 60° with respect to a central axis CA of said optical fibers. At the tapered end, a fluorescent plate or a fluorescent layer is arranged as a detection surface 152. The secondary electrons 105' which are projected onto the detection surface are converted into photons 20. At least part of the generated photons 20 are coupled into the first end of the optical fibers and are conveyed or directed through said optical fiber towards a photo-detector. The photons 20 are confined inside optical fiber due to total internal reflection at the side surface of the optical fibers. The optical fibers 156' may be at least partially coated with a photo-reflecting layer, as schematically indicated at one of the fibers in FIG. 19.

Objective Lens Unit And Scanning (Internal: Box 270)

Figure 20A:
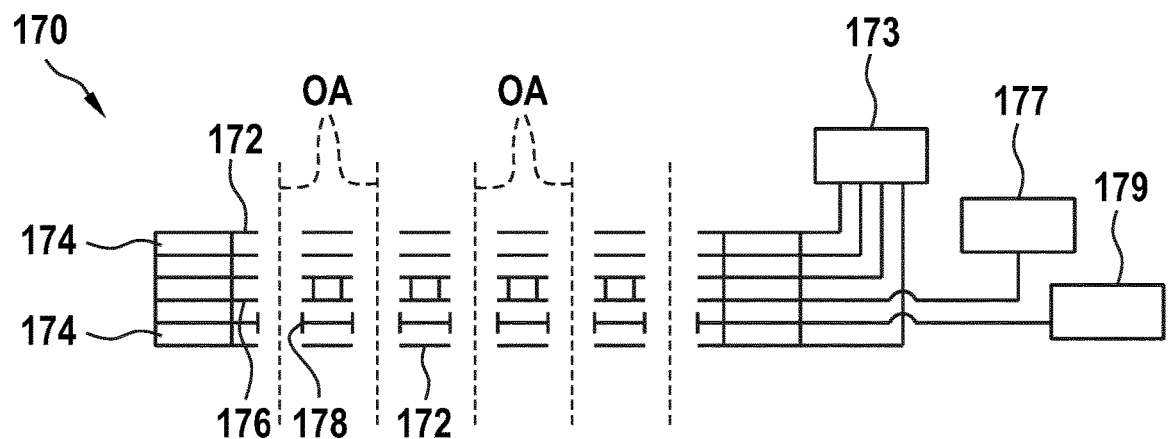
FIGS. 20A to 20D show schematic views of an objective lens unit according to embodiments described herein, wherein modifications of electrodes are described.

FIG. 20A shows an objective lens unit 170. Various aspects, details, features, and modifications of an objective lens unit are described with respect to FIGS. 20A to 20D. Corresponding embodiments may be combined with other embodiments described herein, particularly embodiments described for the various sections of the charged particle beam column as described herein.

The objective lens unit includes three or more electrodes with holes 272. The holes 272 form an array of holes. One hole or opening is provided for a single primary beamlet and/or for each of the beamlets, respectively. Accordingly, the array of holes corresponds to the array of primary beamlets. As shown in FIG. 20A optical axes OA are provided for each of the primary beamlets. The three or more electrodes form an electrostatic lens component.

According to embodiments of the present disclosure, insulator plates 174 are provided between two electrodes of the three or more electrodes. According to some embodiments, which can be combined with other embodiments described herein, and insulator plate 174 includes one opening for the passing of two or more primary beamlets, particularly for the passing of all primary beamlets through the one opening of the insulator plate 174. The three or more electrodes are biased to different potentials to form a lens field for the primary beamlets. Particularly, according to some embodiments, which can be combined with other embodiments described herein, the electrodes are configured to generate the deceleration field for decelerating the primary beamlets traveling towards a specimen. For example, a deceleration field between the second last electrode and the last electrode can be at least 5 kV/mm.

Figure 20B:
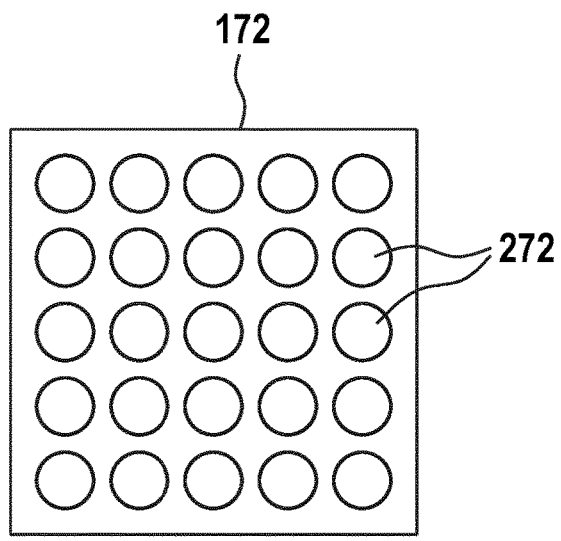

According to some embodiments, which can be combined with other embodiments described herein, one or more electrodes of the three or more electrodes can be an electrode 172, as shown in FIG. 20B. The electrode 172 includes holes 272 or openings, and particularly an array of holes. The electrode 172 is configured to provide a common potential around each of the holes 272. The electrode 172 provides a common potential for the array of primary beamlets. As shown in FIG. 20A, the electrode 172 can be connected to a power supply 173 or a controller. Each of the electrodes is biased to a potential. Particularly, neighboring electrodes 172 (neighboring along the optical axes) can be biased to different potentials to generate a lens field.

Figure 20C:
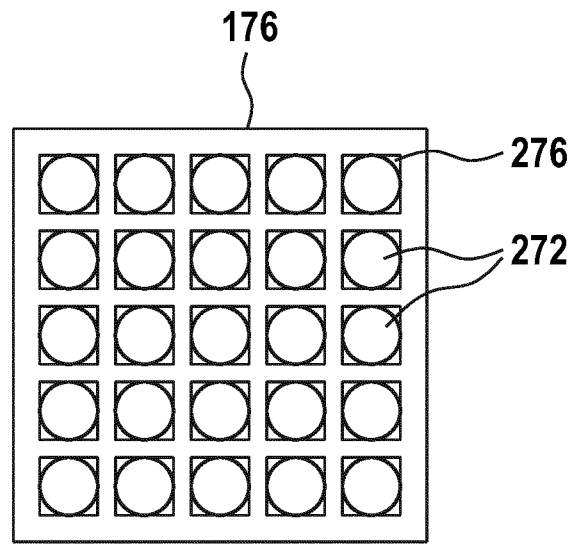

According to some modifications, one or more electrodes of the three or more electrodes can be an electrode 176, as shown in FIG. 20C. The electrode 176 includes holes 272 or openings, and particularly an area of holes. As indicated by conductive portions 276, wherein the holes 272 may include individual conductive portions, each of the holes or openings can be provided with a different potential. The electrode 176 is connected to a power supply 177 or controller. The power supply or controller can control the potential of each of the individual conductive portions. The capability of providing different potentials for different openings allows to provide a fine adjustment of the lens field for a respective primary beamlet, for example, for each primary beamlet individually. FIG. 20C shows conductive portions 276 for each of the holes 272. According to yet further embodiments, which can be combined with other embodiments described herein some of the openings may have a common conductive portion 276 such that some of the openings may be biased to the same potential. Yet, at least two distinct conductive portions are provided. At least a first conductive portion of a first hole 272 can be biased to a first potential, and at least a second conductive portion of a second hole can be biased to a second potential different from the first potential.

Figure 20D:
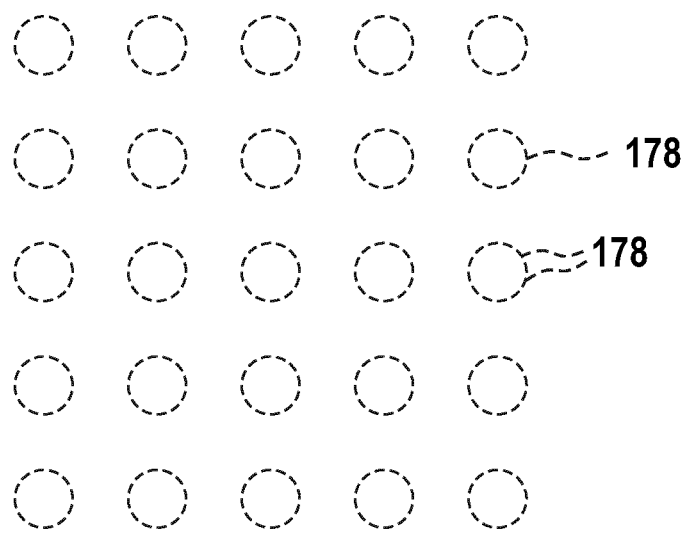

FIG. 20D illustrates a yet further modification of an electrode, which may be combined with other embodiments described herein. An electrode of the objective lens unit 170 may include four or more, for example, eight deflection electrodes 178. The deflection electrodes 178 may be controlled to generate deflection fields for each of the primary beamlets in the XY plane. Yet further, octupoles fields and/or quadrupole fields may be generated for aberration correction. The electrode having the individual deflection electrodes can be connected to a power supply 179 or controller. For example, each of the deflection electrodes can be connected by an insulated wire to allow for individual biasing of the deflection electrodes. According to some embodiments, the electrode having the deflection electrodes can be manufactured as a microelectromechanical systems (MEMS). A MEMS technology deflector allows for a higher multi-pole density and eases the wiring of the electrodes.

According to some embodiments, which can be combined with other embodiments described herein, an objective lens unit may include three or more electrodes, for example 3 to 10 electrodes, with arrays of holes 272. Insulator plate 174, as described above, can be provided between adjacent electrodes. One of said electrodes can be provided with deflection electrodes 178 described with respect to FIG. 20D. The example shown in FIG. 20A includes a first electrode 172, a second electrode 172, the third electrode 172, the first individual focusing electrode 176 having conductive portions 276, an electrode having deflection electrodes 178 and the fourth electrode 172. For example, a deceleration field can be provided between the electrode having deflection electrodes and the fourth electrode 172. The deflection field can be at least 5 kV/mm.

According to some embodiments, a charged particle beam device for irradiating or inspecting a specimen with an array of primary beamlets is provided. The charged particle beam device includes a charged particle beam source for generating a primary charged particle beam and a multi-aperture lens plate having a plurality of apertures for forming four or more primary beamlets from the primary charged particle beam. Two or more electrodes having one opening, e.g. having one opening each, for the primary charged particle beam or the four or more primary beamlets are provided, the two or more electrodes and the multi-aperture lens plate can be biased to provide a focusing effect. The charged particle beam device further includes a collimator for deflecting a first primary beamlet, a second primary beamlet, a third primary beamlet, and a fourth primary beamlet of the four or more primary beamlets with respect to each other. The charged particle beam device further includes a scanning deflector assembly for scanning the four or more primary beamlets over a surface of the specimen and an objective lens unit having three or more electrodes, each electrode having openings for the four or more primary beamlets. The openings are spaced apart at an opening distance, wherein the objective lens unit is configured to focus the four or more primary beamlets on the specimen. According to some implementations, the objective lens unit may further be configured to focus four or more signal beamlets on detection surfaces. The charged particle beam device further includes a stage for supporting the specimen. At least one of the three or more electrodes of the objective lens unit includes four or more deflection electrodes per primary beamlet, each electrode having an opening per primary beamlet, and a stage supporting the specimen. Accordingly, beam positions of the individual primary beamlets can be adjusted on the specimen.

According to embodiments described herein, the primary charged particle beamlets are focused on separate locations on the specimen 80 by the objective lens unit 170 to simultaneously inspect the specimen at the separate locations. The objective lens unit 170 may be configured for focusing the primary charged particle beamlets onto the specimen, wherein the objective lens is a retarding field lens. For instance, the retarding field lens may decelerate the primary charged particle beamlets to a defined landing energy. In some embodiments, the energy reduction from the column energy to the landing energy on the specimen is at least a factor of 10, for example at least a factor of 30. In one example, the landing energy is typically between about 100 eV and 8 keV, more typically 2 keV or less, e.g. 1 keV or less, such as 500 eV or even 100 eV.

Adjacent or within the objective lens unit 170 a scanning deflector assembly 271 can be provided as exemplarily shown in FIG. 2. The scanning deflector 271 can provide a scanning field for the array of primary beamlets. For example, a scanning field can be provided individually for the beamlets. For example, the scanning deflector assembly 271 can be a magnetic scanning deflector assembly. According to yet further modifications, additionally or alternatively an electrostatic scanning deflector assembly can be provided. According to some embodiments, the scanning deflector assembly can be provided between the objective lens unit 170 and the beam separation unit 160. The scanning deflector assembly may additionally or alternatively be provided between two electrodes of the two or more electrodes of the objective lens unit 170.

Stage (Internal: Box 280)

Figure 21:
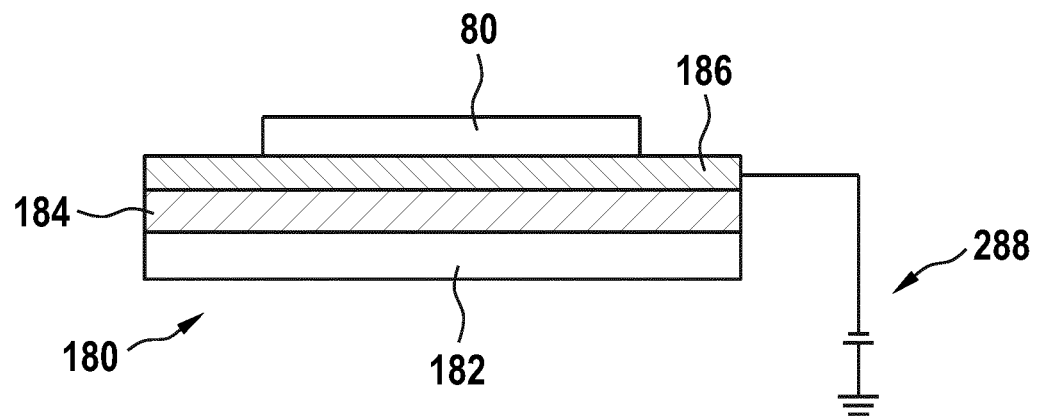
FIG. 21 shows a schematic view of the stage for a charged particle beam device according to embodiments described herein.

FIG. 21 illustrates a stage 180, which can be provided in a charged particle beam device 100 according to embodiments of the present disclosure. The stage 180 includes a motion assembly 182. The motion assembly 182 includes drives to move the specimen 80 at least in x-direction, y-direction, and z-direction. Accordingly, the specimen 80 can be moved relative to the optical axes of the objective lens unit 170 and can adapt the distance between the specimen 80 and the objective lens unit 170. The stage 180 includes an insulating layer 184 and a conductive layer 186. The conductive layer 186 provides the specimen receiving surface. The conductive layer is provided between the specimen 80 and the insulating layer 184. As shown in FIG. 20A, the conductive layer 186 can be connected to a power supply 288. Accordingly, the wafer can be biased.

According to some embodiments, the insulating layer 184 insulates the specimen or wafer from ground. Accordingly, the specimen can be set to potential, for example a high potential of at least 5 kV. Biasing the specimen allows to provide voltages between components of the charged particle beam device as beneficial for electro-optical purposes while reducing voltages in certain areas of the charged particle beam device. For example, the emitter 111 and the specimen 80 can be biased to negative voltages. Accordingly, other components between the emitter and the specimen can be biased to reduced (positive) voltages. Accordingly, the two or more electrodes, the ALA, the collimator, the objective lens unit, and the like do not require high voltages in addition to lower voltages for deflection, aberration correction, focusing or the like.

Figure 22:
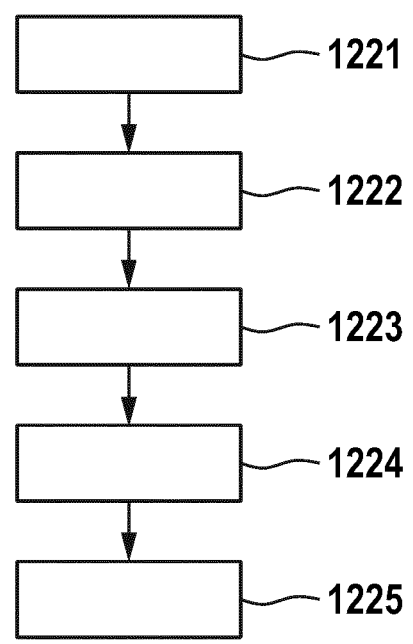
FIG. 22 shows a flow chart illustrating methods of inspecting a specimen with a plurality of primary beamlets in a column of the charged particle beam device.

Embodiments of a method for inspecting a specimen with four or more primary beamlets are described with reference to the flow chart shown in FIG. 22. At operation 1221 a primary charged particle beam is generated with a charged particle source and the four or more primary beamlets are generated with a multi-aperture lens plate and two or more electrodes. Accordingly, an array of primary beamlets can be provided. A first primary beamlet, a second primary beamlet, a third primary beamlet, and a fourth primary beamlet of the four or more primary beamlets are deflected with respect to each other with a collimator in operation 1222. For example, the primary beamlets can be deflected to be parallel. At operation 1223 the four or more primary beamlets are scanned over a surface of the specimen with a scanning deflector assembly and are focused on the specimen with an objective lens unit to generate four or more signal beamlets. The four or more signal beamlets are focused on detection surfaces having a detection distance at operation 1224, wherein one or more detection surfaces is arranged between respective primary beamlets of the four or more primary beamlets. At operation 1225 the four or more signal beamlets are separated from the four or more primary beamlets with a beam separation unit to guide the four or more signal beamlets to the detection surfaces at the detection distance. According to embodiments of the present disclosure, a beamlet distance can be 200 µm and above, particularly 400 µm or above. Accordingly, the openings in the objective lens unit can be 200 µm and above, particularly 400 µm or above. According to embodiments of the present disclosure, the detection distance can be 200 µm and above, particularly 400 µm or above. Accordingly, the pitch between detection surfaces can be provided at the detection distance and/or the signal beamlets impinge on the detection surface with the detection distance. According to some embodiments, which can be combined with other embodiments described herein, the detection distance corresponds to the pitch between the primary beamlets, particularly in the plane of the detection unit. Yet further, according to additional or alternative modifications, the spot size of the four or more signal beamlets can be adjusted in the detection surfaces, particularly wherein the detection distance is larger than the spot size of the four or more signal beamlets on the detection surfaces.

Some embodiments of the present disclose provide a beamlet distance or a opening distance at which the opening of electrodes of the objective lens unit are spaced apart of 200 µm and above, particularly 400 µm or above. Accordingly, the openings can have a size which is e.g. 100 µm or above, particularly 200 µm or above. Thus, the number of signal electrons that can be guided and/or focused on detection surfaces provide for an improved detection efficiency. For example, the detection distance, i.e. the distance of detection surfaces can be similar to the opening distance. Further, the electrodes of the objective lens unit can focus the signal beamlets on the detection surfaces. Accordingly, the size of the openings in the electrodes of the objective lens unit, and correspondingly the opening distance, as optionally in combination with the focusing of signal beamlets provide the advantageous collecting efficiency.

According to some embodiments, which can be combined with other embodiments described herein, the primary beamlets can be deflected and/or astigmatism can be corrected in the objective lens unit with four or more deflection electrodes per primary beamlet. Yet further, additionally or alternatively, the specimen on a stage supporting the specimen may be biased, wherein the stage has an insulating layer.

According to some embodiments, the energy within the charged particle beam device changes dependent on the location in the charged particle beam device. An example is given in the following. For instance, the energy of the primary charged particle beam after the beam emitter and before the multi-aperture lens plate may be about 15 kV and is decelerated in front of the array to about 3 kV, e.g. in the configuration exemplarily shown in FIGS. 3A and 3B, where the two or more electrodes 124 are used in a decelerating mode in front of the multi-aperture lens plate 122. After the multi-aperture lens plate and before the collimator, the energy in the column of the charged particle beam device may be about 3 kV. The collimator may accelerate the primary charged particle beamlets to energy of about 15 kV in some embodiments. The landing energy of the primary charged particle beamlets (which are decelerated by the objective lens) may be below 1 keV, e.g. about 300 eV.

Additionally, the charged particle beam device and the method for inspecting a specimen with a charged particle beam device according to embodiments described herein provide a small spot size of the primary charged particle beamlets on the specimen. The spot size may be understood as a diameter of the area on the specimen illuminated by a single primary charged particle beamlet. For instance, the spot size of a single primary charged particle beamlet of the array of primary charged particle beamlets according to embodiments described herein may typically be less than 20 nm, more typically less than 10 nm, and even more typically less than 5 nm. According to some embodiments, the single primary charged particle beamlets may have a high current density due to the generation of the array of primary charged particle beamlets with a beam source according to embodiments described herein. The high current density helps to increase the signal to noise ratio and, thus, the throughput of the charged particle beam device.

As mentioned above, the charged particle beam device according to embodiments described herein allows for providing an array of primary charged particle beamlets. According to some embodiments, the array of primary charged particle beamlets may typically include three or more primary charged particle beamlets per column, more typically ten or more primary charged particle beamlets. According to some embodiments described herein, the charged particle beam device and the method for inspecting a sample with a charged particle beam device according to embodiments described herein provide an array of primary charged particle beamlets within one column of a charged particle beam device having a distance to each other at the sample surface. For instance, the distance between two primary charged particle beamlets within one column, i.e. neighboring charged particle beamlets in the direction of a row, may typically be 0.2 mm or above and/or 3 mm or below.

In some embodiments, two or more charged particle beam devices according to embodiments described herein may be arrayed in a multi-column multi-beam microscope (MOM). Multiple columns each having an array of primary charged particle beamlets for inspecting a specimen further increases the process speed and throughput.

FIG. 23 shows a charged particle beam device assembly, wherein three charged particle beam devices 100 according to embodiments of the present disclosure are provided in an array. According to some embodiments, one or more charged particle beam devices can be provided in an array, such as a one-dimensional array or a two-dimensional array. The charged particle beam devices each include a charged particle beam source 110, two or more electrodes, i.e. electrodes having an opening for a primary charged particle beam or an opening common to primary charged particle beamlets, an aperture lens array, a collimator 130, optionally a detection unit 150, optionally a beam separation unit 160, and an objective lens unit 170, according to embodiments of the present disclosure and including various modifications described additionally or alternatively with respect to each other in the present disclosure.

The charged particle beam device as shown in FIG. 23 includes multiple columns each having multiple beamlets within the column. The multiple columns are arranged over a specimen stage having the specimen 80. Accordingly, the multicolumn multibeam device can be configured for inspecting a specimen, sample or wafer, particularly a single specimen.

Embodiments of the present disclosure provide a plurality of advantages, some of which are described in the following: The throughput for EBI can be increased, particularly in light of the improved collection efficiency of signal electrons. aberrations, particularly reduced octupole aberrations, for primary beamlets at the perimeter of the array of primary beamlets can be reduced, the overall beam current of the primary beamlets on the specimen can be increased, which increases the signal to noise ratio for imaging, aberrations, particularly hexapole aberration, for primary beamlets can be reduced, contamination, particularly for the beam limiting apertures of the multi-aperture lens plate can be removed and, thus, need for maintenance can be reduced, a pitch of the primary beamlets of the array of primary beamlets can be adjusted at the collimator, beam adjustment of the primary beamlets at the collimator can be measured, and beam positions of the individual primary beamlets can be adjusted on the specimen with the objective lens unit. Further, the separation of primary beamlets from the multi-aperture plate up to impingement on the specimen reduced cross-talk.

While the foregoing is directed to embodiments, other and further embodiments may be devised without departing from the basic scope thereof, and the scope thereof is determined by the claims that follow.

What is claimed is:

1. A charged particle beam device for irradiating or inspecting a specimen with an array of primary beamlets, the charged particle beam device comprising:
    a charged particle beam source for generating a primary charged particle beam;
    a multi-aperture lens plate having a plurality of apertures for forming four or more primary beamlets from the primary charged particle beam;
    two or more electrodes having one opening for the primary charged particle beam or the four or more primary beamlets, the two or more electrodes and the multi-aperture lens plate can be biased to provide a focusing effect;
    a collimator for deflecting a first primary beamlet, a second primary beamlet, a third primary beamlet, and a fourth primary beamlet of the four or more primary beamlets with respect to each other;
    an alignment system provided between the multi-aperture lens plate and the collimator;
    a detection unit having detection surfaces, one or more detection surfaces being arranged between beam paths of the four or more primary beamlets;
    a scanning deflector assembly for scanning the four or more primary beamlets over a surface of the specimen;
    an objective lens unit having three or more electrodes, each electrode having openings for the four or more primary beamlets, the openings spaced apart at an opening distance, the objective lens unit is configured to focus the four or more primary beamlets on the specimen to generate four or more signal beamlets, and to guide the four or more signal beamlets on the detection surfaces; and
    a stage for supporting the specimen.

2. The charged particle beam device according to claim 1, wherein the opening distance is 200 μm and above.

3. The charged particle beam device according to claim 1, wherein the objective lens unit comprises four or more electrodes to adjust a spot size of the four or more signal beamlets on the detection surfaces.

4. The charged particle beam device according to claim 3, wherein the spot size of the four or more signal beamlets is adapted to a detection distance.

5. The charged particle beam device according to claim 1, further comprising a beam separation unit for separating the four or more primary beamlets from the four or more signal beamlets, wherein the beam separation unit comprises:
    a first electrostatic deflector;
    a second electrostatic deflector; and
    a magnetic deflector provided between the first electrostatic deflector and the second electrostatic deflector.

6. The charged particle beam device according to claim 5, wherein the first electrostatic deflector, the second electrostatic deflector and the magnetic deflector form a magnetic circuit.

7. The charged particle beam device according to claim 5, wherein the first electrostatic deflector and the second electrostatic deflector each includes at least two elongated electrodes between rows of the four or more primary beamlets.

8. The charged particle beam device according to claim 1, wherein the plurality of apertures of the multi-aperture lens plate form an aperture array, and wherein a number of apertures in the aperture array is larger than a number of primary beamlets impinging on the specimen.

9. The charged particle beam device according to claim 1, wherein the plurality of apertures of the multi-aperture lens plate has a square shape or an essentially square shape, wherein the essentially square shape is a square shape with rounded corners.

10. The charged particle beam device according to claim 1, further comprising:
    a heater for heating the multi-aperture lens plate.

11. The charged particle beam device according to claim 1, wherein the alignment system includes at least one quadrupole to adapt a pitch between the four or more primary beamlets.

12. The charged particle beam device according to claim 11, further comprising:
    one or more aperture arrays between the multi-aperture lens plate and the objective lens unit, the one or more aperture arrays each having a plurality of apertures for the four or more primary beamlets.

13. The charged particle beam device according to claim 12, wherein the collimator is provided between a first aperture array of the one or more aperture arrays and a second aperture array of the one or more aperture arrays.

14. The charged particle beam device according to claim 12, further comprising:
    a current meter attached to one or more conductive surfaces on at least one aperture array of the one or more aperture arrays.

15. The charged particle beam device according to claim 14, wherein the alignment system is provided between the multi-aperture lens plate and the at least one aperture array.

16. The charged particle beam device according to claim 12, further comprising:
    an aperture array holder for at least one of the one or more aperture arrays, the aperture array holder separating a first vacuum compartment from a second vacuum compartment.

17. The charged particle beam device according to claim 1, wherein the collimator comprises:
    two or more first elongated electrodes for deflecting a row of the four or more primary beamlets along a first direction and two or more second elongated electrodes for deflecting a row of the four or more primary beamlets along a second direction different from the first direction.

18. The charged particle beam device according to claim 1, wherein the collimator is configured to deflect the first primary beamlet, the second primary beamlet, the third primary beamlet, and the fourth primary beamlet of the four or more primary beamlets to emerge from the collimator parallel to each other.

19. The charged particle beam device according to claim 1, wherein the objective lens unit comprises:
    one or more insulator plates provided between two electrodes of the three or more electrodes having one opening for passing the four or more primary beamlets through the one opening of the insulator plate.

20. The charged particle beam device according to claim 19, wherein the one or more insulator plates are configured to allow for a deceleration field for decelerating the primary beamlets traveling towards a specimen, the deceleration field between a second last electrode and a last electrode being at least 5 kV/mm.

21. The charged particle beam device according to claim 1, wherein at least one of the three or more electrodes of the objective lens unit comprises four or more deflection electrodes per primary beamlet.

22. The charged particle beam device according to claim 21, wherein each of the four or more deflection electrodes are connected by an insulated wire to allow for individual biasing of the deflection electrodes.

23. The charged particle beam device according to claim 22, wherein the insulated wire connected to a connector at a side of an array formed by the four or more primary beamlets.

24. The charged particle beam device according to claim 1, wherein the stage for supporting the specimen comprises:
an insulating layer configured to allow for biasing the specimen.

25. A charged particle beam device assembly, comprising:
a first charged particle beam device according to claim 1; and
a second charged particle beam device for irradiating or inspecting the specimen with an array of primary beamlets, the second charged particle beam device comprising:
a charged particle beam source for generating a primary charged particle beam;
a multi-aperture lens plate having a plurality of apertures for forming four or more primary beamlets from the primary charged particle beam;
two or more electrodes having one opening for the primary charged particle beam or the four or more primary beamlets, the two or more electrodes and the multi-aperture lens plate can be biased to provide a focusing effect;
a collimator for deflecting a first primary beamlet, a second primary beamlet, a third primary beamlet, and a fourth primary beamlet of the four or more primary beamlets with respect to each other;
a detection unit having detection surfaces, one or more detection surfaces being arranged between beam paths of the four or more primary beamlets;
a scanning deflector assembly for scanning the four or more primary beamlets over a surface of the specimen; and
an objective lens unit having three or more electrodes, each electrode having openings for the four or more primary beamlets, the openings spaced apart at an opening distance, the objective lens unit is configured to focus the four or more primary beamlets on the specimen to generate four or more signal beamlets, and to focus the four or more signal beamlets on the detection surfaces.

26. The charged particle beam device assembly according to claim 25, wherein the first charged particle beam device and the second charged particle beam device are arranged adjacent to each other over the specimen for irradiating or inspecting different parts of a surface of the specimen at the same time.

* * * * *